United States Patent
Cheng

(10) Patent No.: US 11,092,865 B2
(45) Date of Patent: Aug. 17, 2021

(54) ARRAY SUBSTRATE AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 126 days.

(21) Appl. No.: 16/482,050

(22) PCT Filed: Nov. 16, 2018

(86) PCT No.: PCT/CN2018/116013
§ 371 (c)(1),
(2) Date: Jul. 30, 2019

(87) PCT Pub. No.: WO2019/101019
PCT Pub. Date: May 31, 2019

(65) Prior Publication Data
US 2020/0064700 A1    Feb. 27, 2020

(30) Foreign Application Priority Data

Nov. 27, 2017  (CN) .......................... 201721613630.1

(51) Int. Cl.
*H01L 27/12*    (2006.01)
*G02F 1/1362*   (2006.01)
(Continued)

(52) U.S. Cl.
CPC ...... *G02F 1/136286* (2013.01); *G02F 1/1368* (2013.01); *G02F 1/136204* (2013.01); *H01L 27/0296* (2013.01); *H01L 27/1244* (2013.01)

(58) Field of Classification Search
CPC ............... H01L 27/0296; H01L 27/124; H01L 27/1244; H01L 27/1288; H01L 27/3276;
(Continued)

(56) References Cited

U.S. PATENT DOCUMENTS

2007/0120790 A1* 5/2007 Jeon ....................... G09G 3/006
                                                    345/87
2009/0244429 A1* 10/2009 Chung ................ G02F 1/13458
                                                    349/56
(Continued)

FOREIGN PATENT DOCUMENTS

CN       103460391 A    12/2013
CN       206301112 U     7/2017
(Continued)

OTHER PUBLICATIONS

International Search Report and Written Opinion issued in corresponding International Application No. PCT/CN2018/116013, dated Feb. 13, 2019, with English translation.

*Primary Examiner* — Joseph M Galvin, III
(74) *Attorney, Agent, or Firm* — McDermott Will and Emery LLP

(57) ABSTRACT

An array substrate having a display region and a non-display region, includes signal lines at least located in the display region, signal line leads located in the non-display region, connection portions located in the non-display region for coupling the signal lines to the signal line leads, and the signal lines and the signal line leads are two separate portions.

16 Claims, 13 Drawing Sheets

(51) Int. Cl.
*G02F 1/1368* (2006.01)
*H01L 27/02* (2006.01)

(58) Field of Classification Search
CPC ......... H01L 2251/5338; H01L 27/1255; H01L 2924/0002; H01L 51/0097; H01L 22/32; H01L 27/1225; H01L 27/1259; H01L 27/3258; H01L 27/3262; H01L 2924/00; H01L 29/7869; H01L 2021/775; H01L 21/78; H01L 2227/323; H01L 23/50; H01L 23/60; H01L 27/02; H01L 27/0288; H01L 27/1218; H01L 27/1251; H01L 27/3265; H01L 29/22; H01L 29/24; H01L 29/42356; H01L 29/66757; H01L 29/66969; H01L 29/78651; H01L 29/78675; H01L 29/78696; H01L 33/0041; H01L 51/5237; G02F 1/1345; G02F 1/136204; G02F 1/136254; G09G 3/006

See application file for complete search history.

(56) References Cited

U.S. PATENT DOCUMENTS

| | | | |
|---|---|---|---|
| 2014/0027769 | A1 | 1/2014 | Hara et al. |
| 2016/0349580 | A1* | 12/2016 | Feng ................. G02F 1/133514 |
| 2017/0038654 | A1* | 2/2017 | Cheng ............... G02F 1/133345 |
| 2018/0108649 | A1 | 4/2018 | Cheng |

FOREIGN PATENT DOCUMENTS

| | | |
|---|---|---|
| CN | 207424484 U | 5/2018 |
| CN | 207517281 U | 6/2018 |
| KR | 10-2006-0001652 A | 1/2006 |

* cited by examiner

ARRAY SUBSTRATE AND DISPLAY DEVICE

CROSS-REFERENCE TO RELATED APPLICATION

This application is a national phase entry under 35 USC 371 of International Patent Application No. PCT/CN2018/116013 filed on Nov. 16, 2018, which claims priority to Chinese Patent Application No. 201721613630.1, filed with the Chinese Patent Office on Nov. 27, 2017, titled "ARRAY SUBSTRATE AND DISPLAY DEVICE", which are incorporated herein by reference in their entirety.

TECHNICAL FIELD

The present disclosure relates to the field of display technologies, and in particular, to an array substrate and a display device.

BACKGROUND

As an important component of display devices, the array substrate can be generally divided into a display region and a non-display region. A large number of wires are arranged in the non-display region, and a large number of electronic elements are arranged in the display region.

SUMMARY

An aspect of the present disclosure provides an array substrate having a display region and a non-display region, includes signal lines at least located in the display region, signal line leads located in the non-display region, and connection portions located in the non-display region for coupling the signal lines to the signal line leads. The signal lines and the signal line leads are two separate portions.

In some embodiments, the connection portions and at least one of the signal lines and the signal line leads are located in different layers.

In some embodiments, the signal lines include a plurality of gate lines and a plurality of data lines. The signal line leads include a plurality of gate line leads and a plurality of data line leads. The gate lines are coupled to different gate line leads through different connection portions in one-to-one correspondence. The data lines are coupled to different data line leads through different connection portions in one-to-one correspondence. The array substrate further includes a plurality of sub-pixels arranged in a matrix and defined by the plurality of gate lines and the plurality of the data lines crossing in horizontal and longitudinal direction.

In some embodiments, the gate line includes a first linear body at least located in the display region, and a first block body located in the non-display region. The gate line lead includes a gate line lead body located in the non-display region, and a second block body located at an end of the gate line lead body proximate to the display region. The connection portion couples the first block body to the second block body.

In some embodiments, the data line includes a second linear body at least located in the display region, and a third block body located in the non-display region. The data line lead includes a data line lead body located in the non-display region, and a fourth block body located at an end of the data line lead body proximate to the display region.

The connection portion couples the third block body to the fourth block body.

In some embodiments, the signal lines further include common electrode lines. The signal line leads further include a common electrode lead. The common electrode lines are coupled to the common electrode lead through the connection portions.

In some embodiments, an extending direction of the common electrode lead is consistent with an extending direction of the data lines. Each of the common electrode lines is coupled to the common electrode lead through a corresponding connection portion. Or, the common electrode lead includes a lead body with an extending direction that is consistent with an extending direction of the data lines, and a plurality of fifth block bodies coupled to the lead body and extending toward the common electrode lines. Each of the plurality fifth blocks bodies corresponds to a connection portion. Each of the common electrode lines is coupled to a corresponding fifth block body through a corresponding connection portion.

In some embodiments, each of the common electrode lines is disposed between two adjacent gate lines. The common electrode line includes a third linear body at least located in the display region, and a connection body located in the non-display region. The connection body includes a sixth block body, and the sixth block body is coupled to a corresponding connection portion.

In some embodiments, the connection body further includes a strip-shaped sub-connection body, a strip-shaped direction of the sub-connection body is consistent with an extending direction of the data lines. The third linear body and the sixth block body are respectively located at opposite sides of the sub-connection body along a vertical direction thereof, and the third linear body and the sixth block body are respectively coupled to the sub-connection body at a staggered manner.

In some embodiments, a distance of the sixth block body from a first gate line is less than a distance of the third liner body from the first gate line. The first gate line is a gate line that is farther from the third linear body among two gate lines adjacent to the third linear body. Or, a length of the sub-connection body in an extending direction of the data lines is less than a distance between two gate lines adjacent to the sub-connection body. The length of the sub-connection body in the extending direction of the data lines is greater than or equal to three quarters (¾) of the distance between the two gate lines adjacent to the sub-connection body. Or, a distance of the sixth block body from a first gate line is less than a distance of the third liner body from the first gate line. The first gate line is a gate line that is farther from the third linear body among two gate lines adjacent to the third linear body; and a length of the sub-connection body in an extending direction of the data lines is less than a distance between two gate lines adjacent to the sub-connection body. The length of the sub-connection body in the extending direction of the data lines is greater than or equal to three quarters (¾) of the distance between the two gate lines adjacent to the sub-connection body.

In some embodiments, the array substrate further includes a first electrostatic protection line and first electrostatic protection units located in the non-display region, a second electrostatic protection line and second electrostatic protection units located in the non-display region. An extending direction of the first electrostatic protection line is consistent with the extending direction of the data lines, and the gate line leads are coupled to the first electrostatic protection line through the first electrostatic protection units. An extending direction of the second electrostatic protection line is consistent with an extending direction of the gate lines, and the data lines are coupled to the second electrostatic protection line through the second electrostatic protection units. The first electrostatic protection line is located at a side of the common electrode lead away from the display region. The second electrostatic protection line is located at a side of the data line leads proximate to the display region.

In some embodiments, the first electrostatic protection line and the common electrode lead are an integrated structure. Or, the array substrate further includes a third electrostatic protection unit located in the non-display region, and the first electrostatic protection line is coupled to the common electrode lead through the third electrostatic protection unit. And/or, the array substrate further includes a fourth electrostatic protection unit located in the non-display region, and the second electrostatic protection line is coupled to the common electrode lead through the fourth electrostatic protection unit.

In some embodiments, any one of the first electrostatic protection units, the second electrostatic protection units, the third electrostatic protection unit, and the fourth electrostatic protection unit includes a first transistor, a second transistor, a first connection terminal, and a second connection terminal. A source, a gate of the first transistor and a drain of the second transistor are all coupled to the first connection terminal. A source, a gate of the second transistor and a drain of the first transistor are all coupled to the second connection terminal. The first connection terminal and the second connection terminal are configured to respectively couple two conductors of the array substrate that need to release electrostatic charges to each other.

In some embodiments, the sub-pixel includes: a pixel electrode and a common electrode coupled to a corresponding common electrode line. The pixel electrode includes first strip-shaped sub-electrode(s), and the common electrode includes second strip-shaped sub-electrodes. The first strip-shaped sub-electrode(s) and the second strip-shaped sub-electrodes are alternately arranged, and the first strip-shaped sub-electrode(s) and the second strip-shaped sub-electrodes are both parallel to the data lines. An edge of the sub-connection body proximate to a side of the display region is parallel to the first strip-shaped sub-electrode(s) and the second strip-shaped sub-electrodes.

In some embodiments, in a same column of sub-pixels between two adjacent data lines, pixel electrodes in the sub-pixels of two adjacent rows are respectively coupled to different data lines among the two adjacent data lines. In a same row of sub-pixels, each pixel electrode is coupled to a data line that is disposed at a same side of each sub-pixel of the row.

In some embodiments, the array substrate further includes a column of dummy pixels and a dummy data line located in the non-display region. The dummy pixel column is adjacent to a column of sub-pixels in the display region adjacent to the non-display region. The dummy data line is disposed at a side of the column of dummy pixels away from the display region. The dummy pixel includes a dummy pixel electrode and a dummy common electrode. Dummy pixel electrodes in the column of dummy pixels are not coupled to a data line adjacent to the column of dummy pixels and the dummy data line. Dummy common electrodes in the dummy pixel column are coupled to the common electrode lines.

In some embodiments, the dummy data line is coupled to the common electrode lead. Or, the dummy data line is parallel to the data lines. Or, the dummy data line is coupled to the common electrode lead and parallel to the data lines.

In some embodiments, the dummy pixel electrode includes first dummy strip-shaped sub-electrodes. The dummy common electrode includes second dummy strip-shaped sub-electrodes. The first dummy strip-shaped sub-electrodes and the second dummy strip-shaped sub-electrodes are alternately arranged, and the first dummy strip-shaped sub-electrodes and the second dummy strip-shaped sub-electrodes are parallel to the data lines.

In some embodiments, the connection portions and at least one of the signal lines and the signal line leads are located in different layers, includes: the connection portions, the signal lines and the signal line leads are located in different layers, and the signal lines and the signal line leads are located in a same layer. The connection portions are coupled to the signal line and the signal line leads through first via holes and second via holes, respectively. Or, the connection portions and the signal line leads are located in a same layer, and the connection portions and the signal lines are located in different layers. The connection portions are directly connected to the signal line leads, and the connection portions are coupled to the signal lines through first via holes. Or, the connection portions and the signal lines are located in a same layer, and the connection portions and the signal line leads are located in different layers. The connection portions are directly connected to the signal lines, and the connection portions are coupled to the signal line leads through second via holes.

In another aspect of the present disclosure provides a display device, which includes any one of the array substrate described above.

BRIEF DESCRIPTION OF THE DRAWINGS

In order to describe technical solutions in embodiments of the present disclosure and in the related art more clearly, the accompanying drawings to be used in the description of embodiments and the related art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

In order to make the objects, technical solutions and advantages of embodiments of the present disclosure clearer, the technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In the related art, since wires located in the non-display region are easy to accumulate a large amount of electrostatic charges during the manufacturing process of the array substrate, in a case where the electrostatic charges transfer to the display region, the electronic elements located in the display region are affected, and the electronic elements located in the display region are easily damaged by the electrostatic discharges, which affects a yield of the array substrate.

Figure 1:
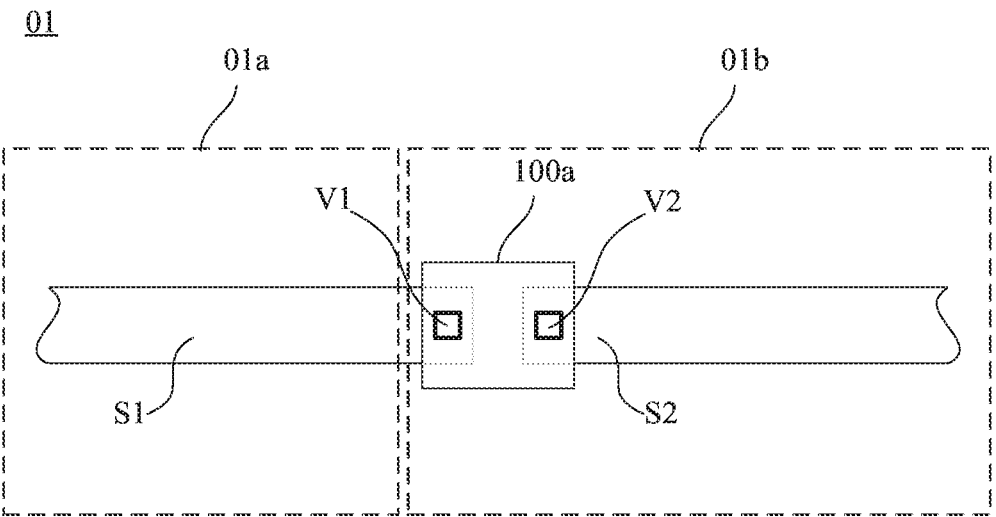
FIG. 1 is a schematic structural diagram of an array substrate, in accordance with some embodiments of the present disclosure.
Figure 2:
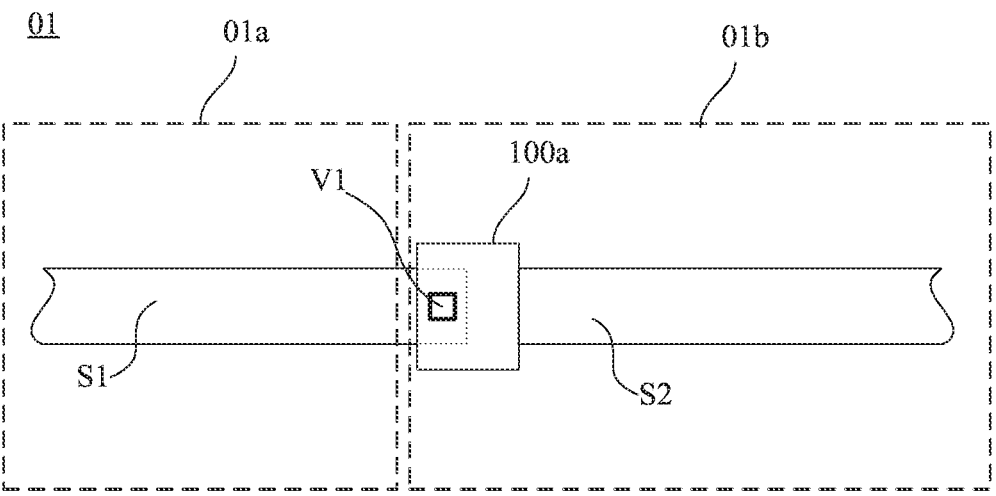
FIG. 2 is a schematic structural diagram of another array substrate, in accordance with some embodiments of the present disclosure.
Figure 3:
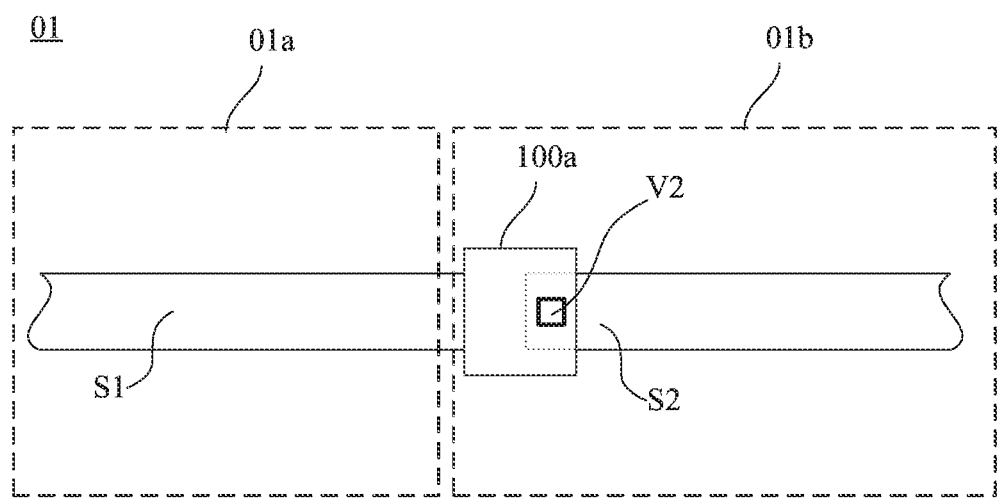
FIG. 3 is a schematic structural diagram of yet another array substrate, in accordance with some embodiments of the present disclosure.

In a first aspect, embodiments of the present disclosure provide an array substrate, as shown in FIGS. 1 to 3, the array substrate 01 includes a display region 01a and a non-display region 01b, signal lines S1 at least located in the display region 01a, signal line leads S2 located in the non-display region 01b, and connection portions 100a located in the non-display region 01b for coupling the signal lines S1 and the signal line leads S2. The signal lines S1 and the signal line leads S2 are two separate portions.

The description that the signal lines S1 and the signal line leads S2 are two separate portions, means that the signal lines S1 and the signal line leads S2 are not in contact with each other, that is, orthographic projections of the signal lines S1 and the signal line leads S2 on a base substrate in the array substrate 01 are not in contact with each other, and the above-described structures are disposed on the base substrate.

In this way, even a large amount of electrostatic charges are accumulated on the signal line leads S2 located in the non-display region 01b, since the signal lines S1 and the signal line leads S2 are disposed as two separate portions (i.e., they are not in contact with each other) in embodiments of the present disclosure, therefore, before the signal lines S1 and the signal line leads S2 are coupled through the above-described connection portions 100a, the large amount of electrostatic charges accumulated on a signal line lead S2 located in the non-display region 01b will not transfer to a corresponding signal line S1 located in the display region 01a, thereby reducing a probability that the electronic elements electrically connected to the signal lines S1 in the display region 01a are damaged by the electrostatic shock, and improving the yield of the array substrate.

For example, in the above array substrate 01 provided by embodiments of the present disclosure, the connection portions 100a and at least one of the signal lines S1 and the signal line leads S2 are located in different layers.

The signal lines S1 and the signal line leads S2 may be located in a same layer, that is, the signal lines S1 and the signal line leads S2 are formed by a patterning process. Or, the signal lines SI1 and the signal line leads S2 may also be located in different layers, that is, the signal lines S1 and the signal line leads S2 are formed by two patterning processes. Embodiments of the present disclosure do not limited thereto, and a setting manner may be selected according to an type of the array substrate and types of the signal lines as long as the connection portions 100a, the signal lines S1, and the signal line leads S2 are not in a same layer, that is, the signal lines S1, and the signal line leads S2 are not directly connected.

Referring to FIG. 1, a setting manner in which the connection portions 100a and at least one of the signal lines S1 and the signal line leads S2 are located in different layers is, for example:

The connection portions 100a, the signal lines S1 and the signal line leads S2 are located in different layers. The signal lines S1 and the signal line lead S2s are located in a same layer. The connection portions 100a are coupled to the signal lines S1 and the signal line leads S2 through first via holes V1 and second via holes V2, respectively.

Since the connection portions 100a, the signal lines S1 and the signal line leads S2 are located in different layers, the array substrate 01 further includes an insulating layer (one or more layers) located between the connection portions 100a and a layer where the signal lines S1 and the signal line leads S2 are located. The above first via holes V1 and second via holes V2 are openings in the insulating layer, so that each connection portion 100a can be coupled to a signal line S1 and a signal line lead S2 through a first via hole V1 and a second via hole V2, respectively.

The specific structure of the insulating layer may be set according to related settings, and will not be described herein.

Referring to FIG. 2, the setting manner in which the connection portions 100a and at least one of the signal lines S1 and the signal line leads S2 are located in different layers is, for another example:

The connection portions 100a and the signal line leads S2 are located in a same layer. The connection portions 100a and the signal lines S1 are located in different layers. The connection portions 100a are directly connected to the signal line leads S2, and the connection portions 100a are coupled to the signal lines S1 through first via holes V1.

Since the connection portions 100a and the signal line leads S2 are located in a same layer, the connection portions 100a and the signal line SI1 are located in different layers, the array substrate 01 further includes an insulating layer (one or more layers) located between a layer where the connection portions 100a and the signal line leads S2 are located and the signal lines S1. The above first via holes V1 are openings in the insulating layer, so that each connection portion 100a can be coupled to a signal line S1 through a first via hole V1.

Referring to FIG. 3, the setting manner in which the connection portions 100a and at least one of the signal lines S1 and the signal line leads S2 are located in different layers is, for yet another example:

The connection portions 100a and the signal lines S1 are located in a same layer, the connection portions 100a and the signal line leads S2 are located in different layers. The connection portions 100a are directly connected to the signal lines S1, and the connection portions 100a are coupled to the signal line leads S2 through second via holes V2.

Since the connection portions 100a and the signal lines S1 are located in a same layer, the connection portions 100a and the signal line leads S2 are located in different layers, the array substrate 01 further includes an insulating layer (one or more layers) located between a layer where the connection portions 100a and the signal lines S1 are located and the signal line leads S2. The above second via holes V2 are openings in the insulating layer, so that each connection portion 100a can be coupled to a signal line lead S2 through a second via hole V2.

Figure 4:
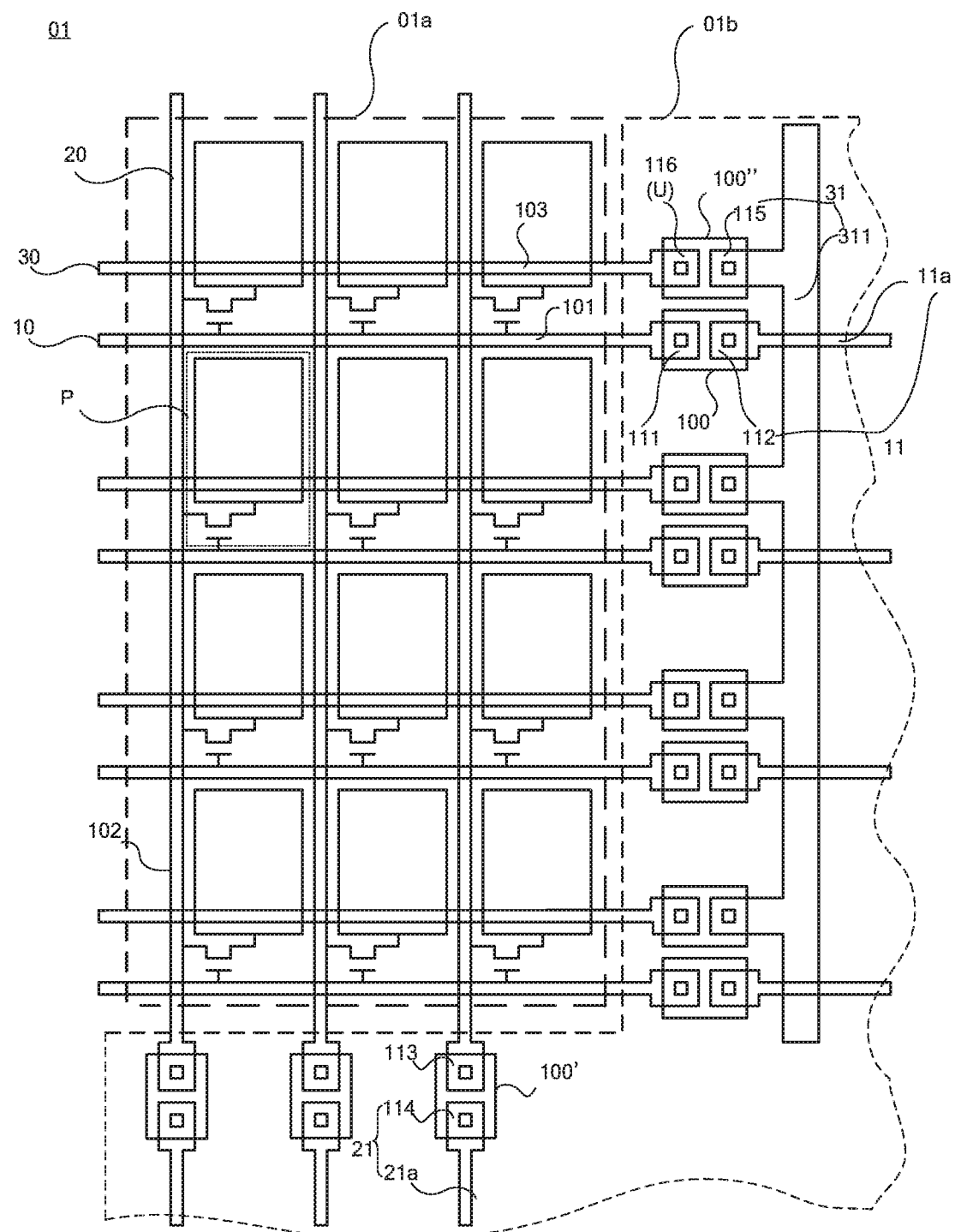
FIG. 4 is a schematic structural diagram of yet another array substrate, in accordance with some embodiments of the present disclosure.

Embodiments of the present disclosure further provide an array substrate. As shown in FIG. 4, the array substrate 01 further includes a plurality of gate lines 10, a plurality of data lines 20, and a plurality of sub-pixels P arranged in a matrix and defined by the plurality of gate lines 10 and the plurality of the data lines 20 crossing in horizontal and longitudinal direction.

Thus, the display region 01a is a region where all the sub-pixels P are located. The non-display region 01b is generally located around the display region 01a, that is, the display region 01a is surrounded by the non-display region 01b.

It will be understood that, the display region 01a and the non-display region 01b are illustrated through a partial structure of the array substrate 01 shown in FIG. 4, the non-display region 01b surrounds the display region 01a, which is not completely shown in FIG. 4.

Since the array substrate 01 includes a large number of wires located in the display region 01a and the non-display region 01b, for example, gate lines, data lines, common electrode lines, and the like located in the display region, and gate line leads coupled to the gate lines, data line leads coupled to the data lines, a common electrode lead coupled to the common electrode lines, and the like located in the non-display region.

Based on this, referring to FIG. 4, the signal lines S1 and the signal line leads S2 may respectively include the gate lines 10 and the gate line leads 11, or may respectively include the data lines 20 and the data line leads 21, or may respectively include the common electrode lines 30 and the common electrode lead 31. Of course, the above combination is only an example, and the signal lines S1 and the signal line leads S2 may also respectively include other wire structures in the array substrate 01 that are located in the display region 01a and the non-display region 01b. Embodiments of the present disclosure do not limit this. In the actual applications, one or more sets of wire structures may be selected to be structures of the above-mentioned signal lines and signal line leads. In the following embodiments, the embodiments of the present disclosure are further described by taking the signal lines including one or more groups of the gate lines, the data lines, and the common electrode lines, and the signal line leads including one or more groups of the gate line leads, the data line leads, and a common electrode lead as an example.

The specific arrangements of the above signal lines S1 and signal line leads S2 will be further described below by some embodiments.

Referring to FIG. 4, the signal lines S1 include the gate lines 10, and the signal line leads S2 include the gate line leads 11. The signal lines S1 further include the data lines 20, and the signal line leads S2 further include the data line leads 21.

For example, each of the gate lines 10 is coupled to a different gate line lead 11 through a different connection portion 100 (each of the connection portions 100 is one of the above connection portions 100a for coupling a gate line 10 and a corresponding gate line lead 11) in one-to-one correspondence.

In addition, in order to simplify wiring, an extending direction of the gate lines 10 is consistent with an extending direction of the gate line leads 11. One end of each gate line lead 11 proximate to the display region 01a is coupled to a gate line 10 through a connection portion 100, and another end of each gate line lead 11 is coupled to a terminal of a gate driving integrated circuit (IC) or an output terminal of a GOA (Gate Driver on Array) circuit.

Based on this, since the connection portions 100 and any one of the gate lines 10 and the gate line leads 11 are located in different layers, each connection portions 100 generally need to be coupled to the gate lines 10 and the gate line leads 11 through via holes. Embodiments of the present disclosure are not limited thereto, and the connection portions 100 may also be disposed in direct contact with the gate lines 10 or the gate line leads 11 according to the specific structure of the array substrate.

For example, in order to ensure that a connection portions 100 can be effectively coupled to the gate lines 10 and the gate line leads 11, so as to reduce contact resistances. Referring to FIG. 4, each gate line 10 includes a first linear body 101 at least located in the display region 01 and a first block body 111 located in the non-display region 01b. Each gate line lead 11 includes a gate line lead body 11a located in the non-display region 01b and a second block body 112 located at an end of the gate line lead body 11a proximate to the display region 01a. Each connection portion 100 couples a first block body 111 to a second block body 112.

In a case where the signal lines S1 further include the data lines 20, and the signal line leads S2 further include the data line lead 21, referring to FIG. 4, each of the data lines 20 is coupled to a different data line lead 21 through a different connection portion 100' (each of the connection portions 100' is one of the above connection portions 100a for coupling a data line 20 and a corresponding data line lead 21) in one-to-one correspondence.

In addition, in order to simplify wiring, an extending direction of the data lines 20 is consistent with an extending direction of the data line leads 21. One end of each data line lead 21 proximate to the display region 01a is coupled to a data line 20 through a connection portion 100', and another end of each data line lead 21 is coupled to a terminal of a source driver IC.

Based on this, since the connection portions 100', the data lines 20 and the data line leads 21 are located in different layers, the connection portions 100' generally need to be coupled to the data lines 20 and the data line leads 21 through via holes. Embodiments of the present disclosure are not limited thereto, and the connection portion 100' may also be disposed in direct contact with the data lines 20 or the data line leads 21 according to the specific structure of the array substrate.

For example, in order to ensure that the connection portions 100' can be effectively coupled to the data lines 20 and the data line leads 21, so as to reduce contact resistances, referring to FIG. 4, each data line 20 includes a second linear body 102 at least located in the display region 01a and a third block body 113 located in the non-display region 01b. Each data line lead 21 includes a data line lead body 21a located in the non-display region 01b and a fourth block body 114 located at an end of the data line lead body 21a proximate to the display region 01a. Each connection portion 100' is coupled to a third block body 113 and a fourth block body 114.

Referring to FIG. 4, the above signal lines further include the common electrode lines 30, and the signal line leads further include the common electrode lead 31. The common electrode lines 30 are coupled to the common electrode lead 31 through the connection portions 100" (each of the connection portions 100" is one of the above connection portions 100a for coupling a common electrode line 30 and the common electrode lead 31).

Based on this, since the connection portions 100", the common electrode lines 30 and the common electrode lead 31 are located in different layers, the connection portion 100" generally need to be coupled to the common electrode lines 30 and the common electrode lead 31 through via holes. Embodiments of the present disclosure are not limited thereto, and the connection portions 100" may also be disposed in direct contact with the common electrode lines 30 or the common electrode lead 31 according to the specific structure of the array substrate.

And, the setting manner in which the above-described common electrode lines 30 are coupled to the common electrode lead 31 through the connection portions 100" is, for example: referring to FIG. 4, an extending direction of the common electrode lines 30 is consistent with the extending direction of the gate lines 10, and each of the common electrode lines 30 is coupled to the common electrode lead 31 through a different connection portion 100".

Of course, all of the common electrode lines 30 may also be coupled to the common electrode lead 31 through a same connection portion 100", that is, without affecting other wire structures, a plurality of connection portions 100" corresponding to the common electrode lines 30 and the common electrode lead 31 in FIG. 4 are connected together and disposed as an integrated structure, and embodiments of the present disclosure are not limited thereto.

Considering that the non-display region 01b is arranged with many complicated structures, in order to avoid the integrated structure formed by the plurality of connection portions 100" connected together causes an adverse effect on other wires, in embodiments of the present disclosure, each of the common electrode lines 30 is coupled to the common electrode lead 31 through a different connection portion 100".

For the common electrode leads 31, as shown in FIG. 4, each common electrode lead 31 includes a lead body 311 that have a same extending direction with the data lines 20, and a plurality of fifth block bodies 115 that are coupled to the lead body 311 and extend a direction toward the common electrode line 30. Each of the fifth block bodies 115 corresponds to a connection portion 100", and each of the common electrode lines 30 is coupled to a corresponding fifth block body 115 through a different connection portion 100", thereby ensuring an effective connection between the connection portions 100" and the common electrode lead 31.

For example, the common electrode lead may include merely the lead body 311 shown in FIG. 4, that is, each of the common electrode lines 30 is coupled to the common electrode lead 31 through a connection portion 100", which is not limited in embodiments of the present disclosure.

Each common electrode line 30 generally includes a third linear body 103 at least located in the display region 01a and a connection body U located in the non-display region 01b. Each common electrode line 30 is disposed at a position between each two adjacent gate lines 10. Generally, an extending direction of the third linear body 103 is consistent with the extending direction of the gate lines 10.

In this case, referring to FIG. 4, each connection body U includes a sixth block body 116, and each connection portion 100" is coupled to a sixth block body 116.

It will be understood that, each sixth block body 116 is generally disposed at an end of a corresponding common electrode line 30 at a side proximate to the common electrode lead 31.

Based on this, since the extending direction of the third linear body 103 in each common electrode line 30 is consistent with the extending direction of the gate lines 10, both of the third linear body 103 and the gate lines 10 need to be coupled to the common electrode lead 31 and the gate line leads 11 at the ends respectively, and are generally in a form of block bodies at coupling positions, which will result in a dense wiring.

Figure 5:
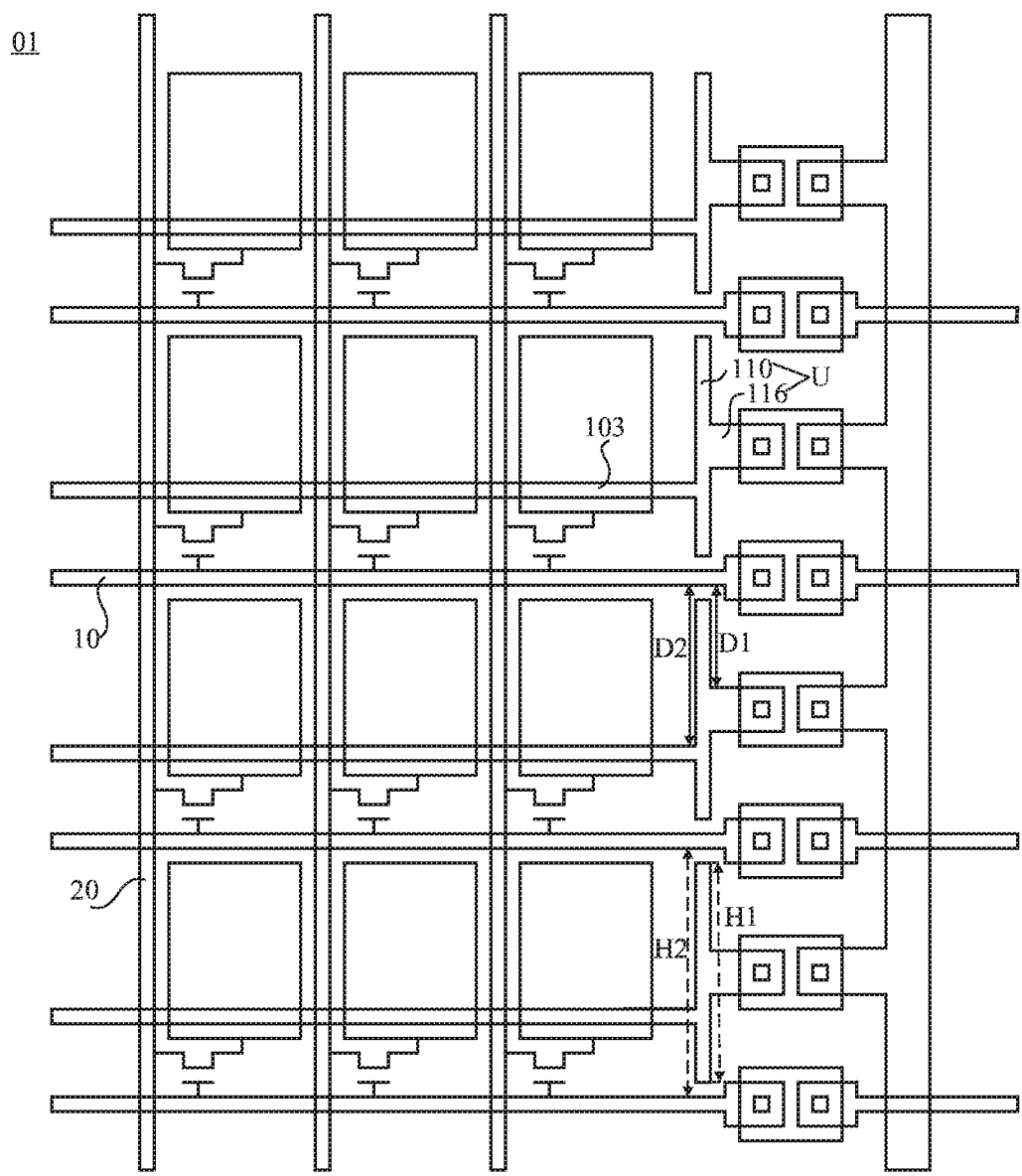
FIG. 5 is a schematic structural diagram of yet another array substrate, in accordance with some embodiments of the present disclosure.

Embodiments of the present disclosure further provide the following structure, as shown in FIG. 5, the connection body U further includes a strip-shaped sub-connection body 110 in addition to the sixth block body 116 described above. The strip-shaped direction of the sub-connection portion 110 is consistent with the extending direction of the data lines 20. The third linear body 103 and the sixth block body 116 are respectively located at both sides of the sub-connection body 110 in a vertical direction thereof, and the third linear body 103 and the sixth block body 116 are coupled to the sub-connection body 110 in a staggered (i.e., misaligned) manner.

A distance D1 of the sixth block body 116 from a first gate line is less than a distance D2 of the third liner body 103 from the first gate line. The first gate line is a gate line 10 that is farther from the third linear body 103 among two gate lines 10 adjacent to the third linear body 103.

It will be understood that, since the sixth block body 116 is coupled to the sub-connection portion 110, in the extending direction of the data lines 20, a size of the sixth block body 116 should be less than a size of the sub-connection portion 110 in the direction for simplifying wirings.

The embodiments of the present disclosure are further illustrated by taking each common electrode line 30 including a sub-connection portion 110 as an example.

The third linear body 103 and a corresponding sixth block body 116 are located at both sides of the sub-connection body 110 along the vertical direction thereof, and the description that the third linear body 103 and the sixth block body 116 are coupled to the sub-connection body 110 in a staggered (i.e., misaligned) manner, means that a connecting position between the sixth block body 116 and the sub-connection portion 110 is not on an extension line of the third linear body 103. By providing the sub-connection portion 110, the sixth block body 116 can be away from the first gate line and coupled to the sub-connection portion 110, thereby making it easy to facilitate lines and avoiding short circuit between the lines.

For example, referring to FIG. 5, a length H1 of the sub-connection portion 110 in the extending direction along the data lines 20 is less than a distance H2 between the two gate lines 10 adjacent to the sub-connection portion 110, and the length H1 is greater than or equal to three quarters (¾) of the distance H2 between the two gate lines 10 adjacent to the sub-connection portion 110, that is, H2> H1>(¾)*H2.

In this way, on the basis of simplifying wiring, by using of the above setting manner, the sub-connection portion 110 may shield the electrostatic charges in the wire structures located in the non-display region 01b, thereby further preventing the electrostatic charges from adversely affecting the structures in the display region 01a.

It will be understood that, the lengths (that is, corresponding sizes along the extending direction of the gate lines) and the widths (that is, corresponding sizes along the extending direction of the data lines) of the first block body 111, the second block body 112, the third block body 111, the fourth block body 112, the fifth block body 115, and the sixth block body 116 are generally greater than any one of linear widths of the first linear body 101, the second linear body 102, and the third linear body 103, so as to ensure an effective connection between each block body and a corresponding connection portion.

Figure 6:
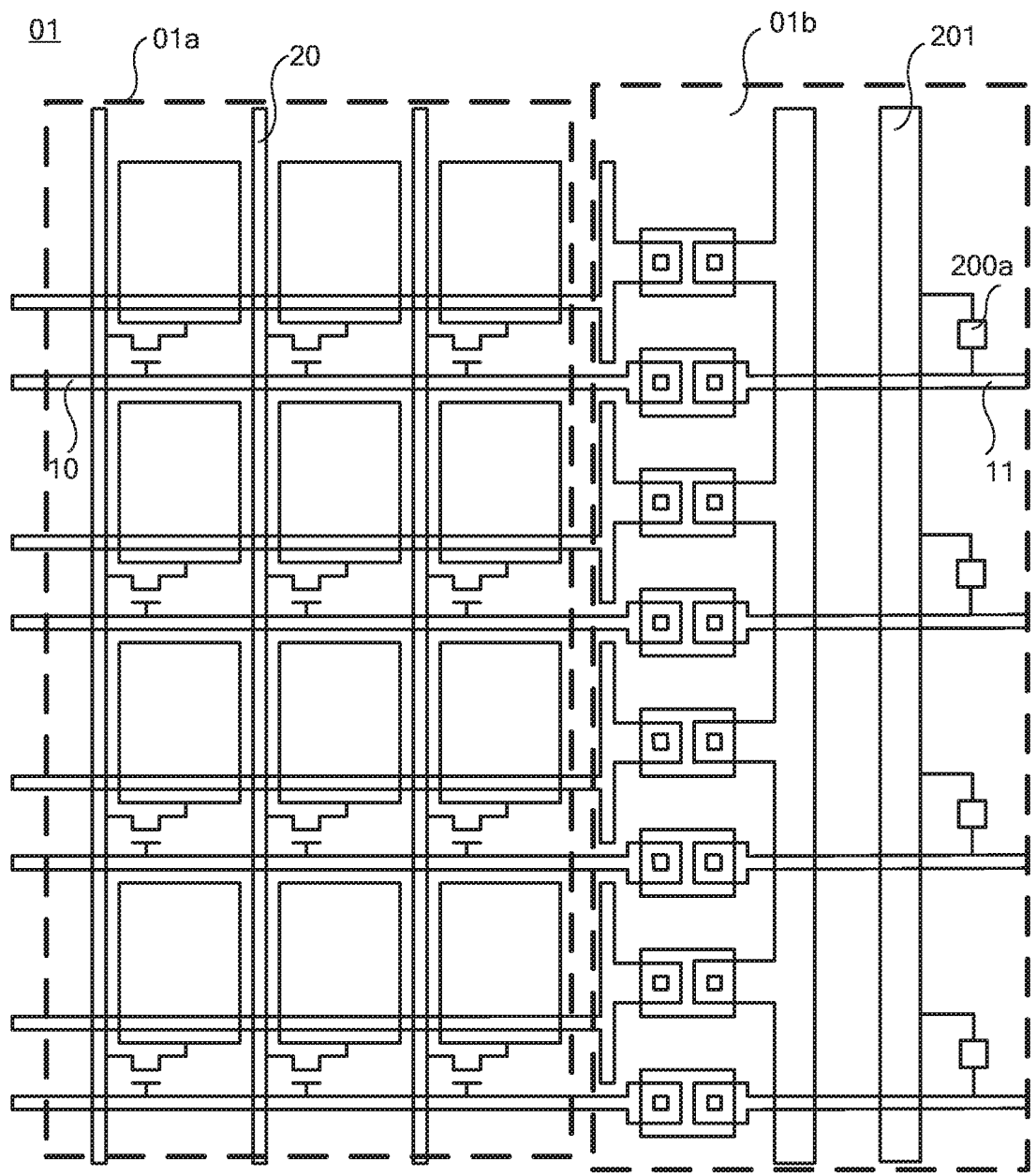
FIG. 6 is a schematic structural diagram of yet another array substrate, in accordance with some embodiments of the present disclosure.

Based on this, in order to ensure that the electrostatic charges accumulated on the gate line leads 11 can be uniformly dispersed to avoid the electrostatic shock to the gate lines 10 located in the display region 01a and the electronic elements such as thin film transistors (TFTs) coupled to the gate line 10s, as shown in FIG. 6, the array substrate 01 further includes a first electrostatic protection line 201 located in the non-display region 01b and having s same extending direction with the data line 20. The gate line leads 11 are coupled to the first electrostatic protection line 201 through first electrostatic protection units 200a.

In this way, in a case where the electrostatic charges accumulated on the gate line leads 11 reaches a certain amount, the electrostatic charges can be transferred from the gate line leads 11 to the first electrostatic protection line 201 through the first static electrostatic protection units 200a, thereby reducing a probability that the corresponding electronic elements located in the display region 01a are damaged by the electrostatic shock.

Since the lead body 311 is arranged with the plurality of fifth block bodies 115 at a side proximate to the display region, in order to simplify wirings, and avoid an adverse effect on the plurality of fifth block bodies 115 extending from a side of the lead body 311 proximate to the display region, referring to FIG. 6, the first electrostatic protection line 201 is located at a side of the common electrode lead 11 away from the display region 01a.

Figure 7:
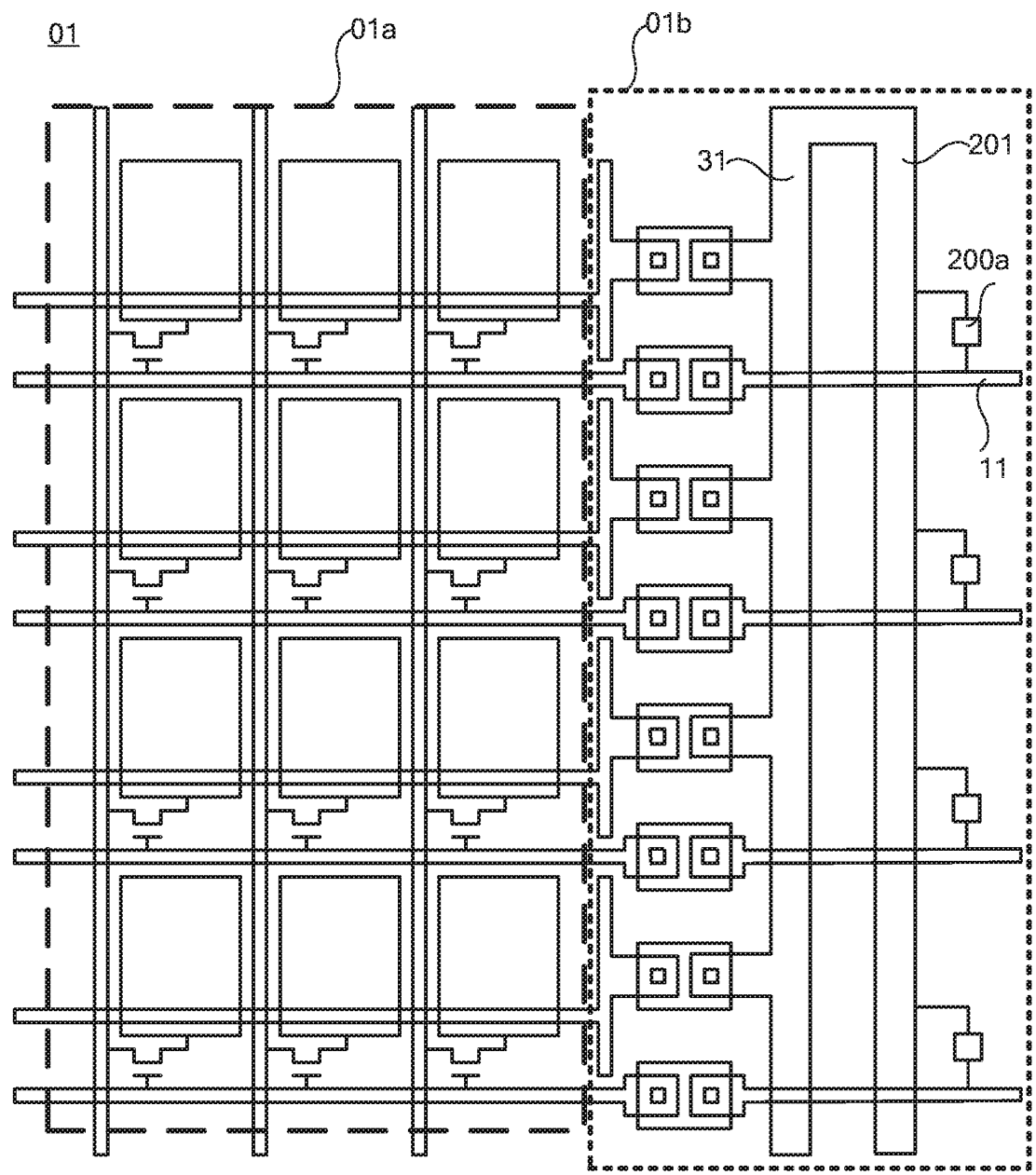
FIG. 7 is a schematic structural diagram of yet another array substrate, in accordance with some embodiments of the present disclosure.

Based on this, as shown in FIG. 7, the first electrostatic protection line 201 and the common electrode lead 31 may be an integrated structure, that is, the first electrostatic protection line 201 and the common electrode lead 31 are located in a same layer and made of a same material, that is, the integrated structure are formed by a same patterning process.

Figure 8:
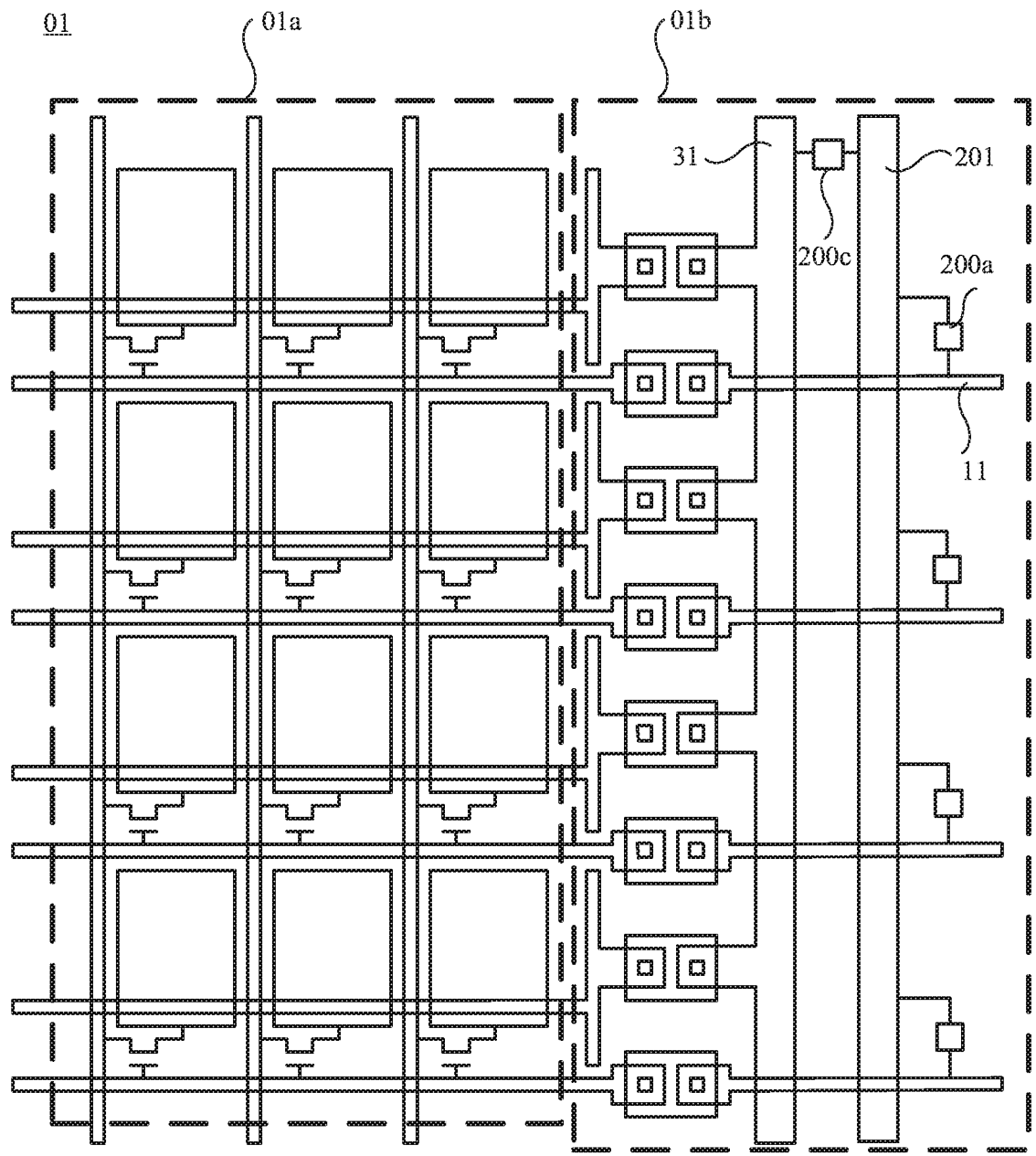
FIG. 8 is a schematic structural diagram of yet another array substrate, in accordance with some embodiments of the present disclosure.

Or, as shown in FIG. 8, the first electrostatic protection line 201 is coupled to the common electrode lead 31 through a third electrostatic protection unit 200c. In this way, electrostatic charges accumulated on the gate line leads 11 and the common electrode lead 31 may be effectively dispersed, thereby reducing a probability that the corresponding electronic elements located in the display region 01a are damaged by the electrostatic shock.

Figure 9:
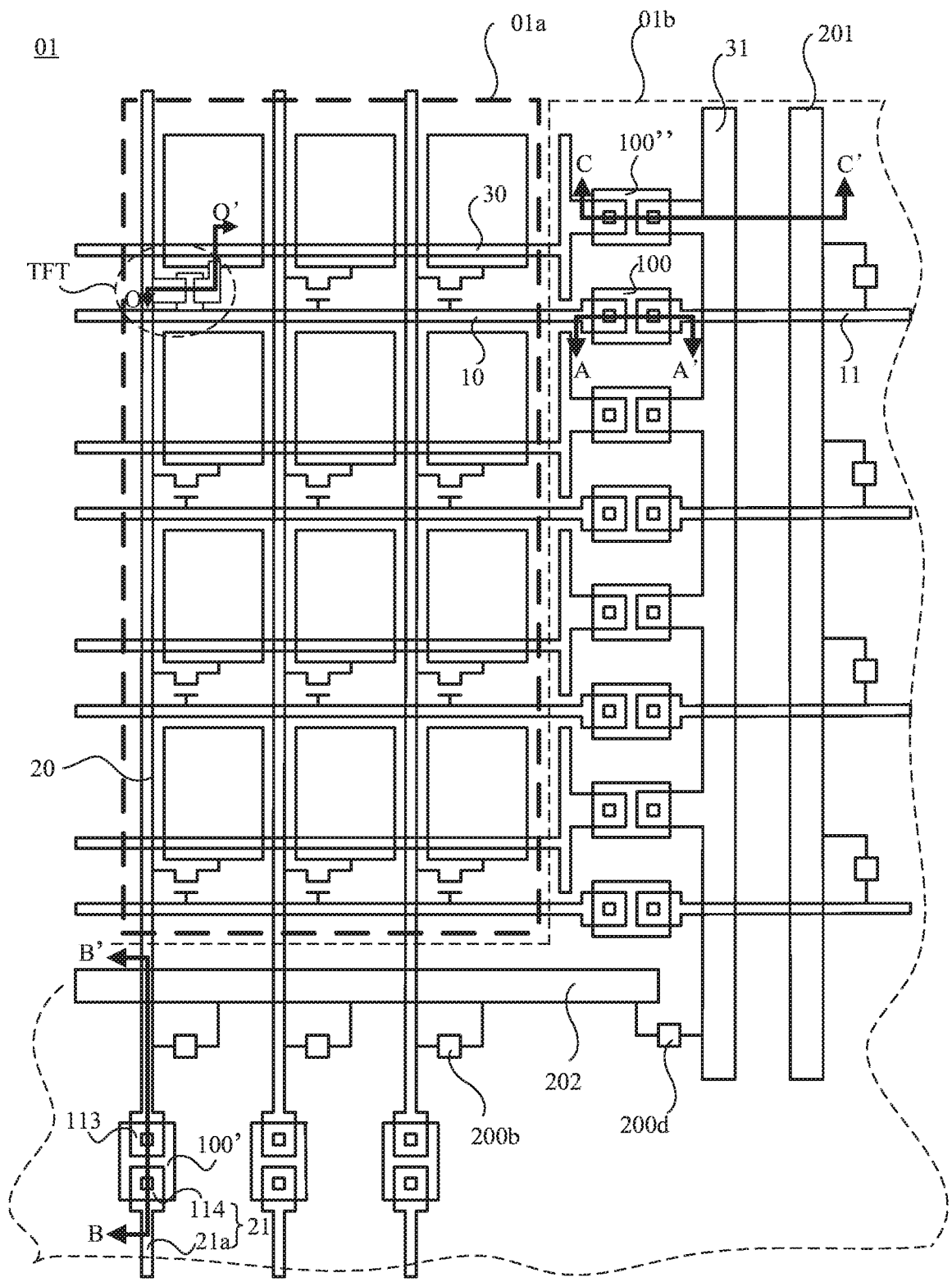
FIG. 9 is a schematic structural diagram of yet another array substrate, in accordance with some embodiments of the present disclosure.

In order to ensure that the electrostatic charges accumulated on the data line leads 21 can be uniformly dispersed to avoid the electrostatic shock to data lines located in the display region 01a and the electronic elements such as the TFTs coupled to the data lines, as shown in FIG. 9, the array substrate 01 further includes a second electrostatic protection line 202 located in the non-display region 01b and having a same extending direction with the gate lines 10. The data lines 20 are coupled to the second electrostatic protection line 202 through second electrostatic protection units 200b.

In this way, in a case where the electrostatic charges accumulated on the data line leads 21 reaches a certain amount, the electrostatic charges can be dispersed to the second electrostatic protection line 202 through the second electrostatic protection units 200b, thereby reducing a probability that the corresponding electronic elements in the display region 01a is damaged by the electrostatic shock.

Since a large number of wire structures are disposed at a side of the data line leads 21 away from the display region (for example, wires bonded to the source driver IC, etc.), in order to simplify wirings and avoid an adverse effect on the wire structures disposed at the side of the data line leads 21 away from the display region, referring to FIG. 9, the second electrostatic protection line 202 is located at a side of the data line leads 21 proximate to the display region 01a.

Referring to FIG. 9, the second electrostatic protection line 202 may also be coupled to the common electrode lead 31 through a fourth electrostatic protection unit 200d, so that the electrostatic charges accumulated on the common electrode lead 31 and the data lines 20 can be further uniformly dispersed.

Figure 10:
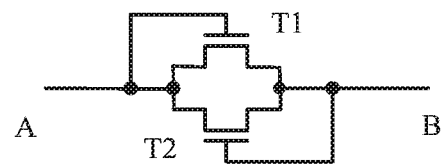
FIG. 10 is a schematic structural diagram of an electrostatic protection unit in an array substrate, in accordance with some embodiments of the present disclosure.

As shown in FIG. 10, a structure of any one of the first electrostatic protection units 200a, the second electrostatic protection units 200b, the third electrostatic protection unit 200c, and the fourth electrostatic protection unit 200d provided by embodiments of the present disclosure may include: a first transistor T1, a second transistor T2, and two terminals including a first connection terminal A and a second connection terminal B. A source, a gate of the first transistor T1 and a drain of the second transistor T2 are all coupled to the first connection terminal A, and a source, a gate of the second transistor T2 and a drain of the first transistor T1 are all coupled to the second connection terminal B.

A connection between the source and the gate of the first transistor T1 can be coupled through a conductive pattern in a same layer as pixel electrodes. The source and the gate of the second transistor T2 can also be coupled by a conductive pattern in a same layer as pixel electrodes.

The first connection terminal A and the second connection terminal B of any one of the first electrostatic protection units 200a, the second electrostatic protection units 200b, the third electrostatic protection unit 200c, and the fourth electrostatic protection unit 200d are respectively coupled to two conductors of the array substrate that need to release electrostatic charges to each other.

For example, the two conductors that need to release electrostatic charges to each other may be a gate line lead 11 and the first electrostatic protection line 201 shown in FIG. 7 described above, or may be the common electrode lead 31 and the first electrostatic protection line 201 shown in FIG.

8, or may be a data line 20 and the second electrostatic protection line 202 shown in FIG. 9 and the like.

Figure 11:
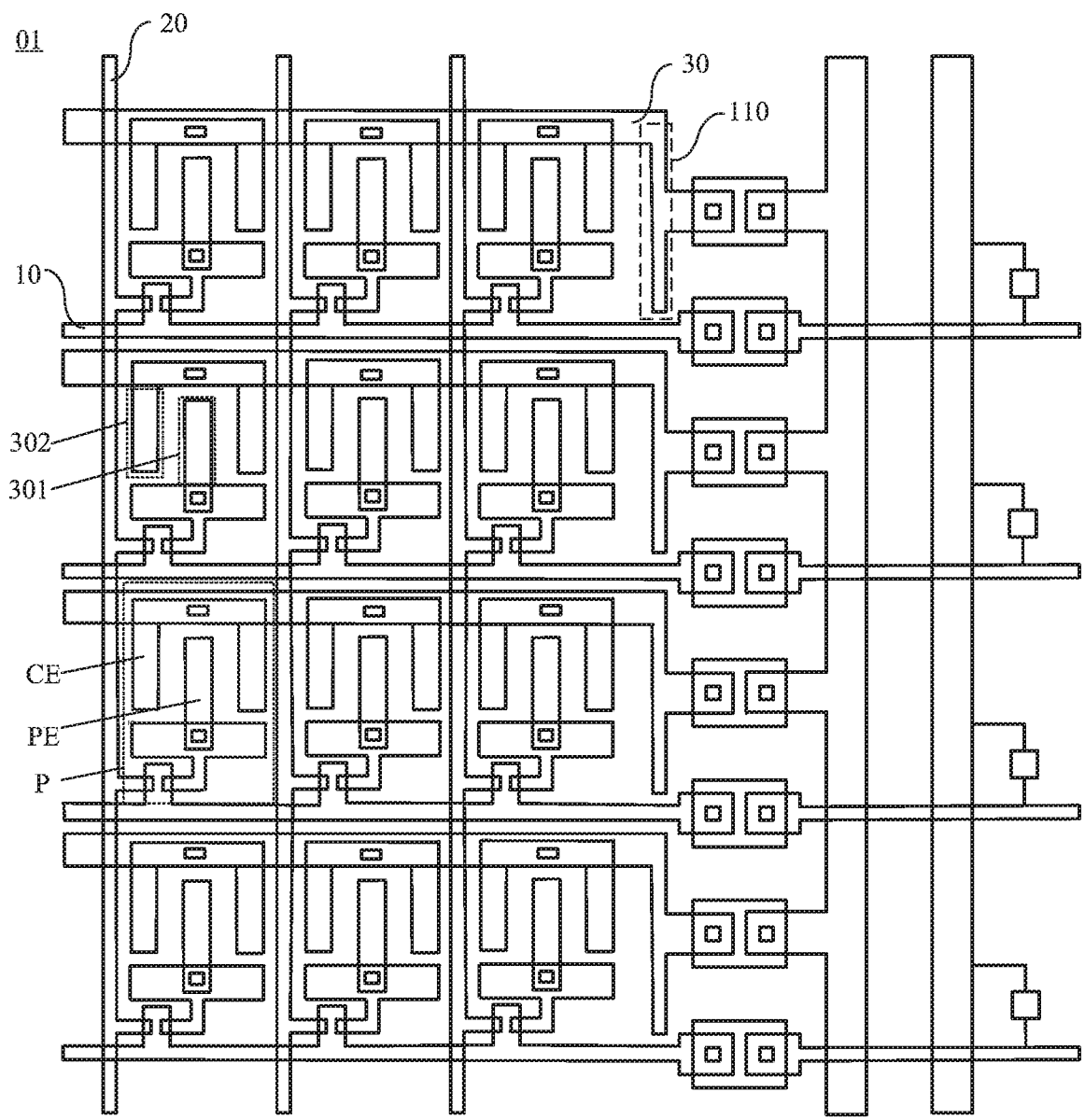
FIG. 11 is a schematic structural diagram of yet another array substrate, in accordance with some embodiments of the present disclosure.
Figure 12:
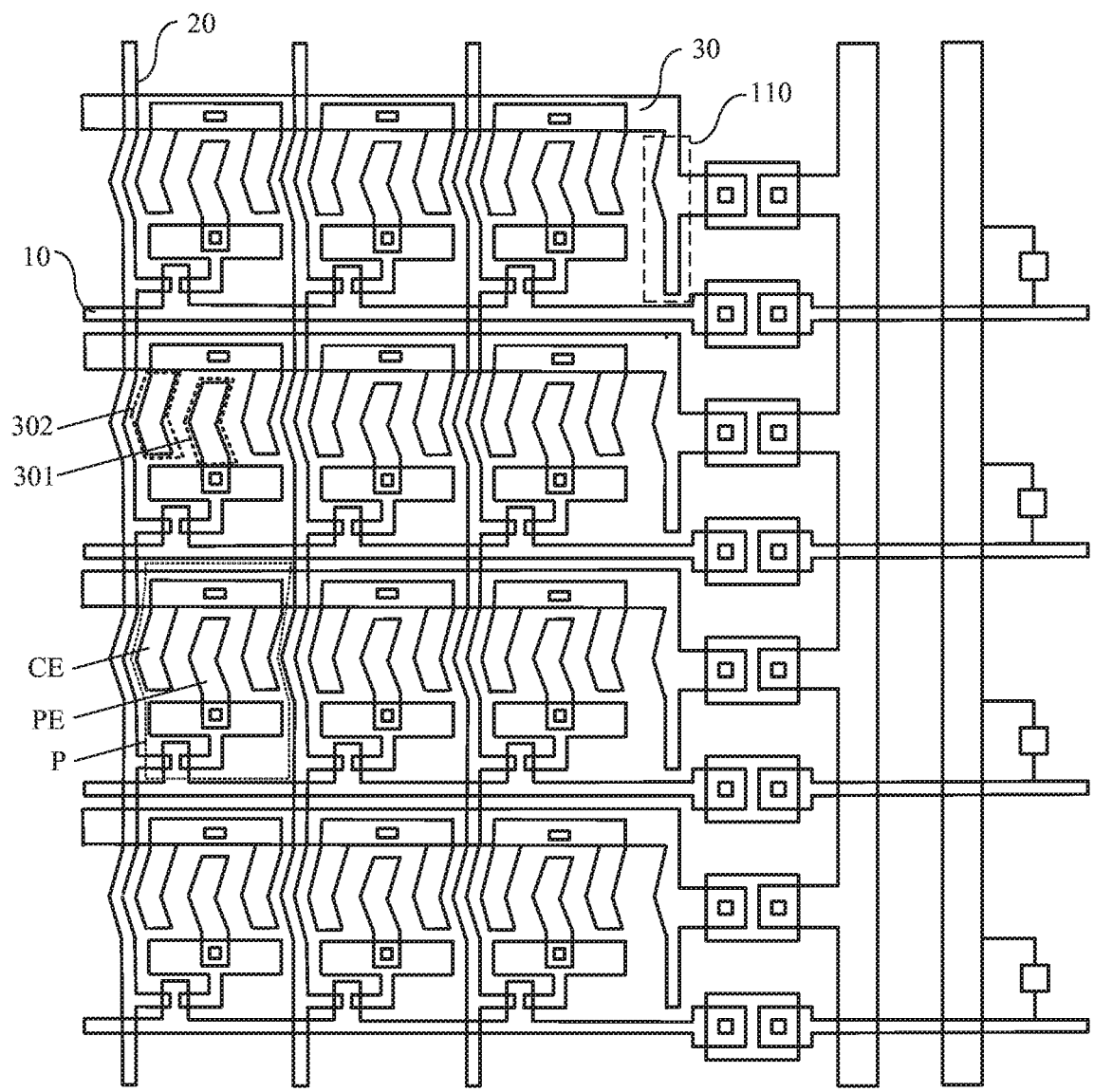
FIG. 12 is a schematic structural diagram of yet another array substrate, in accordance with some embodiments of the present disclosure.

As shown in FIG. 11 or 12, each sub-pixel includes a pixel electrode PE and a common electrode CE coupled to a common electrode line 30. The pixel electrode PE is generally coupled to a drain of a thin film transistor (for example, may be coupled through via hole(s)), and the common electrode CE in each sub-pixel is coupled to a common electrode line 30 (for example, may be coupled through via hole(s)).

As an example of embodiments of the present disclosure, each pixel electrode PE includes first strip-shaped sub-electrode(s) 301, and each common-electrode CE includes second strip-shaped sub-electrodes 302, and the first strip-shaped sub-electrode(s) 301 and the second strip-shaped sub-electrodes 302 are alternately arranged. In addition, the first strip-shaped sub-electrode(s) 301 and the second strip-electrode sub-electrodes 302 are both parallel to the data lines 20, that is, the array substrate is an IPS (In Plane Switch) type array substrate.

The following embodiments are all described by taking the array substrate 01 as an IPS type as an example for further explanation of embodiments of the present disclosure.

The description that the first strip-shaped sub-electrode(s) 301 and the second strip-shaped sub-electrodes 302 are parallel to the data lines 20, means that each first strip-shaped sub-electrode 301 is parallel to a portion of a corresponding data line 20 (the portion is a portion of a data line proximate to a gate line of two adjacent gate lines that is closer to the first strip-shaped sub-electrode 301). Each second strip-shaped sub-electrode 302 is parallel to a portion of a corresponding data line 20 of (the portion is a portion of a data line proximate to a gate line of two adjacent gate lines that is closer to the second strip-shaped sub-electrode 302).

In this case, the pixel electrodes and the common electrodes may be made of a transparent conductive material (i.e., with a relatively high transmittance), or made of a metal material (i.e., with a relatively low resistivity), which is not limited in embodiments of the present disclosure.

For the data line 20, as shown in FIG. 11, the data line 20 is straight linear. Or as shown in FIG. 12, the data line 20 is not straight linear, for example, the data line 20 has a bent structure.

The data line having the bent structure and the strip-shaped sub-electrode having the bent structure shown in FIG. 12 can make the display device including the array substrate have a greater viewing angle.

Based on this, referring to FIGS. 11 and 12, a boundary of the sub-connection body 110 in the common electrode line 30 proximate to a side of the display region 01a is parallel to the first strip-shaped sub-electrode 301 and the second strip-shaped sub-electrode 302 (that is, parallel to the data lines 30), thereby ensuring that pixel electrodes and common electrodes that are proximate to the non-display region 01b can form uniform electric fields, so that the quality of display frames is better.

The above description is only based on the array substrate of IPS type as an example, and embodiments of the present disclosure are not limited thereto, and an ADS (Advanced-Super Dimensional Switching) type array substrate is also applicable to embodiments of the present disclosure. For example, referring to structures shown in FIGS. 11 and 12, the boundary of the sub-connection body 110 at the side proximate to the display region 01a can be set to be parallel to the first strip-shaped sub-electrode 301 in the pixel electrode PE.

Based on this, in a case where the array substrate is applied to an actual display, in order to solve a problem caused by an asymmetry of a forward voltage and a negative voltage supplied to each pixel electrode, in related art, the pixel electrodes is generally driven by the dot inversion. Taking N-rows of gate lines disposed in the array substrate as an example, for one frame of display, in the related art, driving the pixel electrodes by the dot inversion requires that a polarity of an electrical signal supplied to each data line is inverted N times within a display frame period. As a result, taking a display format that a frame rate is 60 Hz as an example, the polarity of the electrical signal supplied to each data line needs to be inverted at a frequency of 60*N Hz, thereby increasing the energy consumption.

Figure 13:
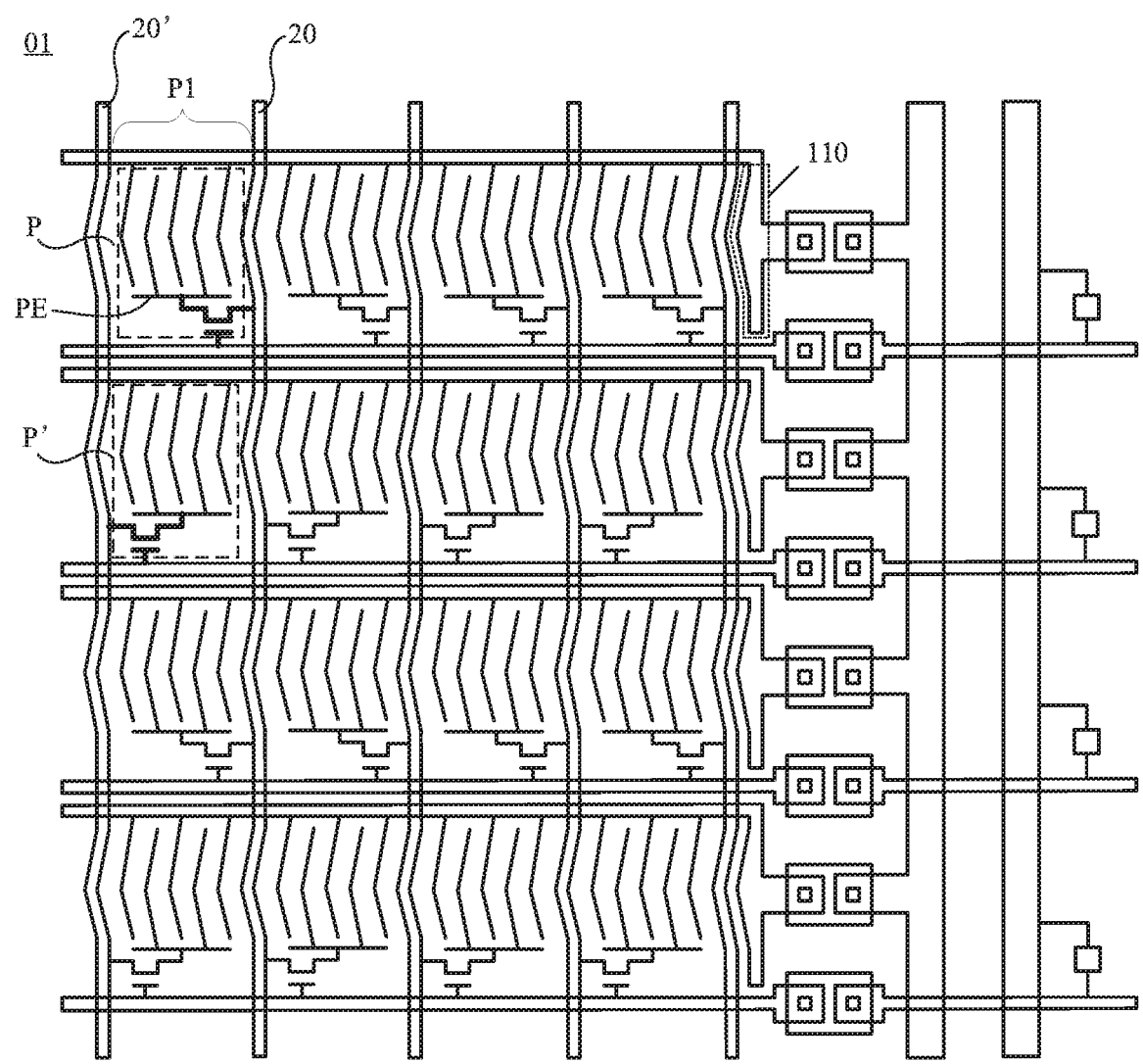
FIG. 13 is a schematic structural diagram of yet another array substrate, in accordance with some embodiments of the present disclosure.

In order to solve the above technical problem, as shown in FIG. 13, in sub-pixels P1 of a same column between two adjacent data lines (20 and 20'), pixel electrodes of sub-pixels (P and P') of two adjacent rows are respectively coupled to different data lines among the two adjacent data lines (20 and 20'), and pixel electrode of each sub-pixel in a same row is coupled to a data line located at a same side of this sub-pixel.

For example, referring to FIG. 13, in sub-pixels P1 of a same column, the pixel electrode of each sub-pixel P is electrically connected to a data line 20 located at a right side through a thin film transistor, and the pixel electrode of each sub-pixel P' is electrically connected to a data line 20' located at a left side through a thin film transistor. The pixel electrode of each sub-pixel located in a same row is electrically connected to a data line located at a same side of this sub-pixel.

The above is only a schematic explanation, and the setting manner in which the pixel electrodes of sub-pixels (P and P') of two adjacent rows are respectively coupled to different data lines among two adjacent data lines (20 and 20') can be interchanged, as long as the pixel electrodes of sub-pixels of the two adjacent rows are respectively coupled to different data lines among the two adjacent data lines.

In this way, for the display format with the frame rate of 60 Hz, the polarity of the electrical signal supplied to each data line is inverted at a frequency of 60 Hz, so that an effect of the dot inversion for the array substrate may be achieved, thereby significantly reducing the frequency of a polarity inversion of the electrical signal supplied to each data line and reducing the energy consumption of the display device including the array substrate.

The above embodiments are only described by taking a display format of a frame rate of 60 Hz as an example. The display device including the array substrate can be set different display formats as needed when displaying.

Figure 14:
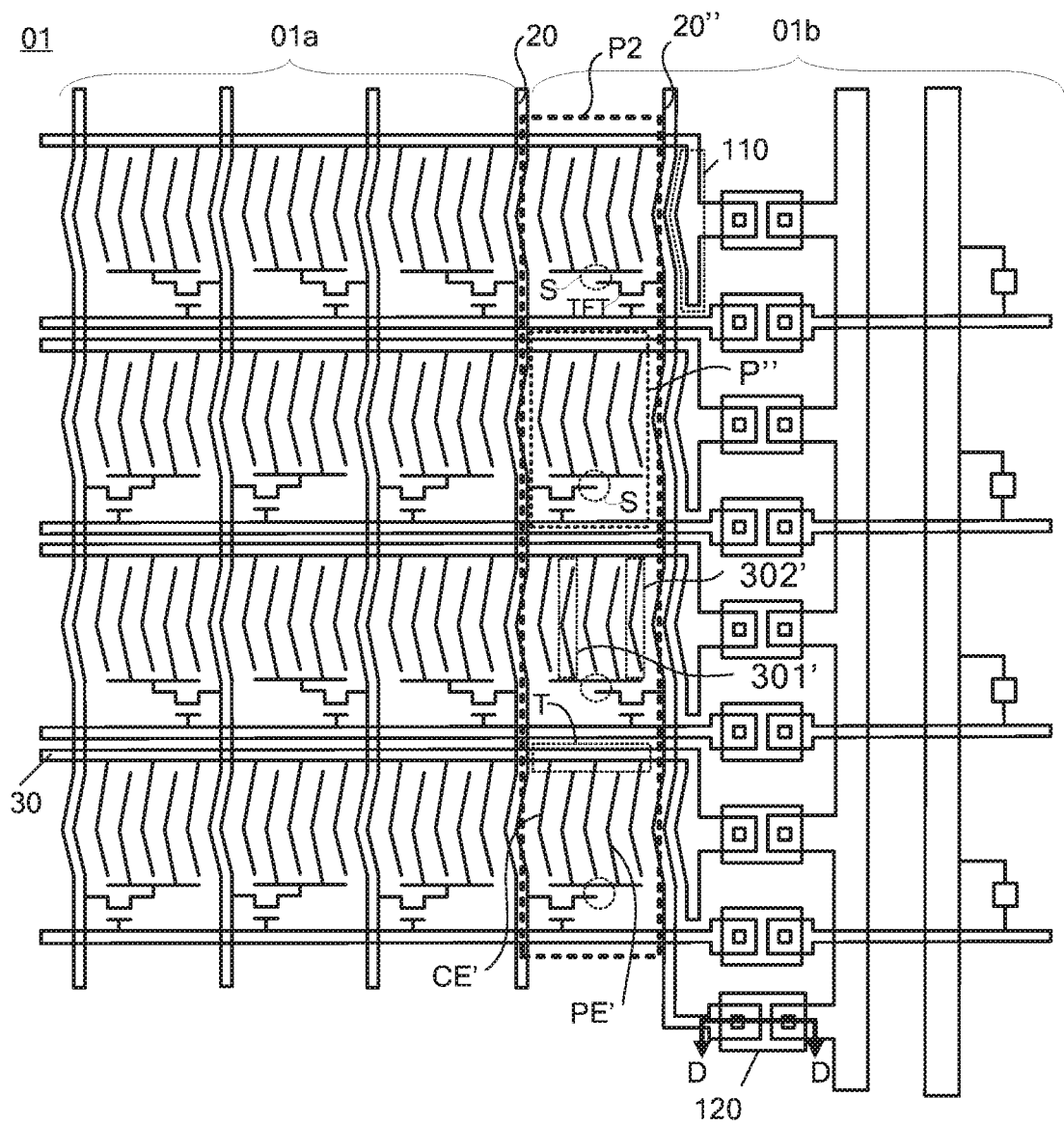
FIG. 14 is a schematic structural diagram of yet another array substrate, in accordance with some embodiments of the present disclosure.

In some embodiments, in order to ensure that the display device including the array substrate described above can display normally and stably at a position proximate to the non-display region, as shown in FIG. 14, the array substrate 01 further includes a dummy pixel column P2 located in the non-display region 01b and adjacent to a sub-pixel column located in the display region 01a. The dummy pixel column P2 is provided with a dummy data line 20" at a side of the dummy pixel column away from the display region 01a.

Each of dummy pixels P'' in the dummy pixel column P2 includes a dummy pixel electrode PE' and a dummy common electrode CE', and dummy pixel electrodes PE' in the dummy pixel column P2 are not coupled to an adjacent data line 20 and the dummy data line 20" (referring to a portion shown by S in FIG. 14). Dummy common electrodes CE' in the dummy pixel column P2 are coupled to the common electrode lines 30.

In this way, in a case where the display device including the array substrate described above perform a display, the dummy pixel column is not used for an actual display, so as to ensure that uniform electric fields can be formed in sub-pixels located at an edge of the display region, thereby displaying frames normally and stably and further improving the display effect.

The dummy common electrodes CE' in the dummy pixel column P2 are generally located in a same layer and made of a same material as the common electrodes in the sub-pixels located in the display region 01*a*. In this way, the dummy common electrodes CE' and the common electrodes in the sub-pixels can be formed by one patterning process.

The dummy pixel electrodes PE' in the dummy pixel column P2 are generally located in a same layer and made of a same material as the pixel electrodes in the sub-pixels located in the display region 01*a*. In this way, the dummy pixel electrodes PE' and the pixel electrodes in the sub-pixels can be formed by one patterning process.

A thin film transistor may not be disposed in the dummy pixel in the dummy pixel column, so that each pixel electrode is not coupled to the dummy data line.

Referring to FIG. 14, the dummy data line 20" is parallel to the data lines 20 to further ensure that the display device including the array substrate may display frames normally and stably at a position proximate to the non-display region 01*b*.

In order to simplify the process, the dummy data line 20" may also be located in a same layer and made of a same material as the data line 20*a* located in the display region 01*a*, that is, the dummy data line 20" and the data lines 20 are formed by one patterning process.

In addition, in order to further shield the electrostatic charges accumulated on the wires located in the non-display region 01*b* through the dummy pixel column, referring to FIG. 14, each dummy pixel electrode PE' includes first dummy strip-shaped sub-electrodes 301', and each dummy common electrode CE' includes second dummy strip-shaped sub-electrodes 302'. The first dummy strip-shaped sub-electrodes 301' and the second dummy strip-shaped sub-electrode 302' are alternately arranged, and the first dummy strip-shaped sub-electrodes 301' and the second dummy strip-shaped sub-electrodes 302' are both parallel to the data lines 20.

The description that the first dummy strip-shaped sub-electrodes 301' and the second dummy strip-shaped sub-electrodes 302' are both parallel to the data lines 20, means that each first dummy strip-shaped sub-electrode 301' is parallel to a portion of a corresponding data line 20 (the portion is a portion of a data line proximate to a gate line of two adjacent gate lines that is closer to the first dummy strip-shaped sub-electrode 301'). Each second dummy strip-shaped sub-electrode 302' is parallel to a portion of a corresponding data line 20 (the portion is a portion of a data line proximate to a gate line of two adjacent gate lines that is closer to the second dummy strip-shaped sub-electrode 302').

In the above-described FIGS. 13 and 14, for the data line 20, the data line 20 may be non-linear, for example, the data line 20 has a bent structure; or the data line 20 may be a linear.

Figure 15:
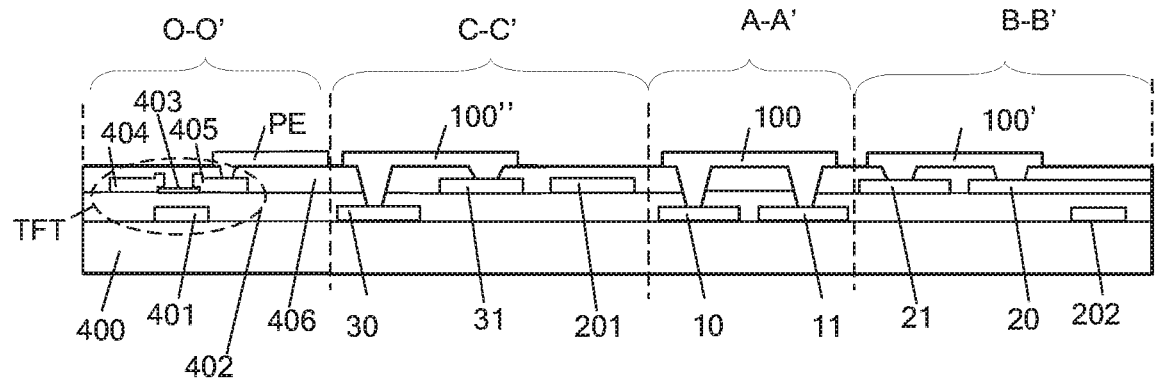
FIG. 15 is a schematic diagram of a combination of cross-sectional structures of FIG. 9 taken along lines O-O', A-A', B-B' and C-C'.
Figure 17:
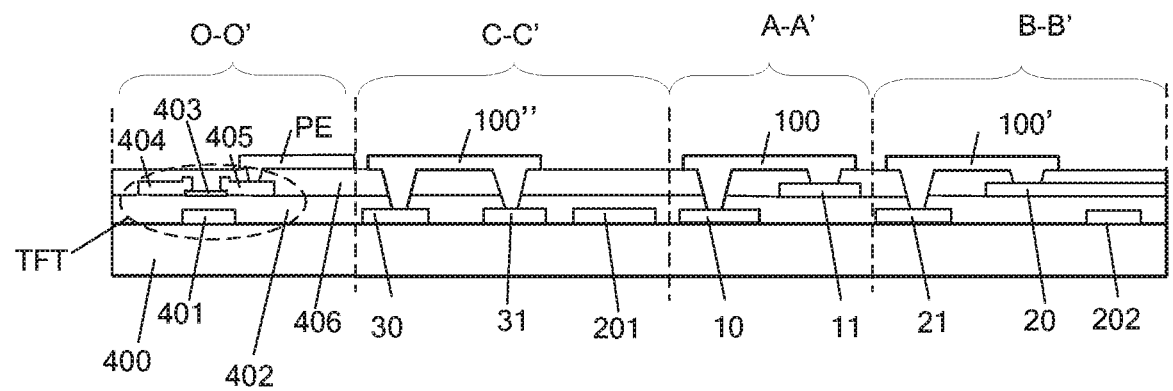
FIG. 17 is another schematic diagram of a combination of cross-sectional structures of FIG. 9 taken along lines O-O', A-A', B-B' and C-C'.

Based on this, in order to simplify the preparation process of the array substrate and reduce the manufacturing cost, the above two or more types of wire structures may be formed by one patterning process as follow:

The relationship between layers of the gate lines 10, gate line leads 11, data lines 20, data line leads 21, common electrode lines 30, common electrode lead 31, first electrostatic protection line 201, and second electrostatic protection line 202 will be further described below with reference to FIGS. 9, 15, and 17. In order to better explain the relationship between the layers, FIGS. 15 and 17 are schematic views showing two simple combination of cross-sectional views of the positions of O-O', A-A', B-B', and C-C' in FIG. 9. For the actual cross-sectional structure of each position, it is sufficient to refer to each position.

In addition, the position of O-O' in FIGS. 15 and 17 shows the connection manner between the thin film transistor (TFT) in the sub-pixel P and the pixel electrode PE, and the cross-sectional structure of the position. Herein, the thin film transistor TFT is used as a bottom gate type as an example, a gate electrode 401, a gate insulating layer 402, an active layer 403, a pattern layer including a source 404 and a drain 405, a passivation layer 406, a pixel electrode PE, and the like are formed on a base substrate 400 in sequence, and embodiments of the present disclosure are not limited thereto. The thin film transistor TFT may also be of a top-gate type, and may be selected according to actual needs, and the specific structure will not be described again.

As an example of embodiments of the present disclosure, referring to FIGS. 9 and 15, the gate lines 10 are located in a same layer and made of a same material as the common electrode lines 30 and the gate line leads 11. That is, the gate lines 10, the common electrode lines 30 and the gate line leads 11 are formed by a same patterning process.

The gate line 10 at the position of A-A' and the gate at the position of O-O' are an integrated structure formed by one patterning process.

The data lines 20 are located in a same layer and made of a same material as the data line leads 21 and the common electrode lead 31, that is, the data lines 20, the data line leads 21 and the common electrode lead 31 are formed by a same patterning process.

The source 404 and drain 405 at the position of O-O' and the data line 20 at the position of B-B' are generally formed by one patterning process.

Based on this, referring to the positions of C-C' and B-B' in FIG. 15, the data line 20 is located in a same layer and made of a same material as the first electrostatic protection line 201, that is, the data lines 20 and the first electrostatic protection line 201 are formed by a same patterning process.

In addition, referring to the position of A-A' and B-B' in FIG. 15, the gate line 10 is located in a same layer and made of a material as the second electrostatic protection line 202, that is, the gate lines 10 and the second electrostatic protection line 202 are formed by a same patterning process.

Figure 16:
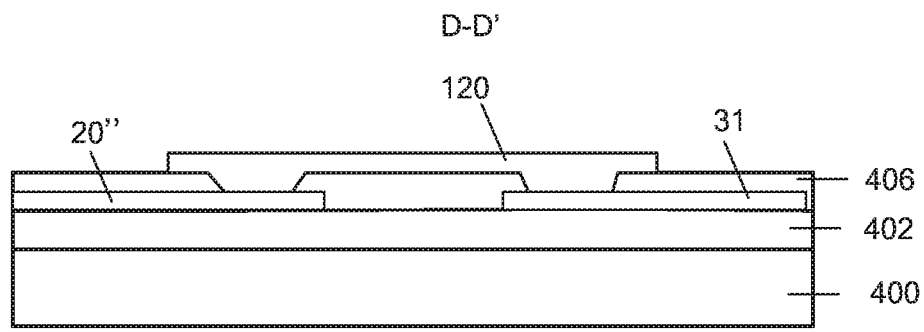
FIG. 16 is a schematic cross-sectional structural diagram of FIG. 14 taken along the line D-D'.

Based on this, for the array substrate shown in FIG. 14, as shown in FIG. 16 (this figure is a cross-sectional view along the position of D-D' of FIG. 14, and the specific relationship between the layers can be referred to the FIG. 15), the dummy data line 20" is coupled to the common electrode lead 31. In this way, the dummy pixel column is not used for the actual display during display, and the electrostatic charges accumulated on the wires located in the non-display region can be shielded and separated through the dummy pixel column, thereby further ensuring that the display frames on the display region may be displayed normally and stably.

For the connection manner between the dummy data line 20" and the common electrode lead 31, referring to FIG. 16, the dummy data line 20" and the common electrode lead 31 may be coupled in a manner that a conductive pattern located in other layer (for example, a layer of the pixel electrodes) is used as an intermediate connection body 120, or directly contacted in contact with each other. Embodiments of the present disclosure are not limit thereto, and the connection manner may be set according to actual needs.

As another example of embodiments of the present disclosure, as shown in FIG. 17 (FIG. 9 may be combined for reference to FIG. 17), the gate line 10 is located in a same layer and made of a same material as the common electrode line 30, the common electrode lead 31, and the data line lead 21, that is, the gate lines 10, the common electrode lines 30, the common electrode lead 31, and the data line leads 21 are formed by a same patterning process.

Referring to FIG. 17, the data line 20 is located in a same layer and made of a same material as the gate line lead 11, that is, the data lines 20 and the gate line leads 11 are formed by a same patterning process.

Further, in combination with the positions of A-A', B-B' and C-C' in FIG. 17, the gate line 10 is located in a same layer and made of a same material as the first electrostatic protection line 201 and the second electrostatic protection line 202, that is, the gate lines 10 and the first electrostatic protection line 201 and the second electrostatic protection line 202 are both formed by a same patterning process.

Figure 18:
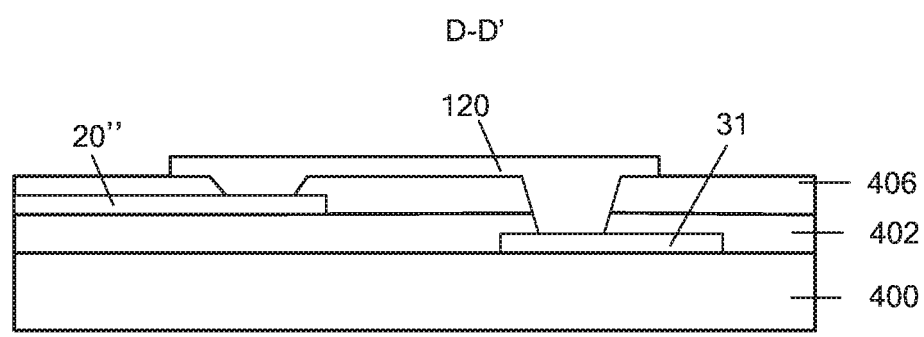
FIG. 18 is another schematic cross-sectional structural diagram of FIG. 14 taken along the line D-D'.

Based on this, for the array substrate shown in FIG. 14, as shown in FIG. 18 (this figure is a cross-sectional view along the position of D-D' of FIG. 14, and the specific relationship of the layers can be referred to FIG. 17), the dummy data line 20" is coupled to the common electrode lead 31. In this way, the dummy pixel column is not used for the actual display during display, and the electrostatic charges accumulated on the wires located in the non-display region can be shielded and separated through the dummy pixel column, thereby further ensuring that the display frames on the display region may be displayed normally and stably.

For the connection manner between the dummy data line 20" and the common electrode lead 31, referring to FIG. 18, the dummy data line 20" and the common electrode lead 31 may be coupled in a manner that a conductive pattern located in other layer (for example, a layer of pixel electrodes) is used as the intermediate connection body 120, or directly contacted in contact with each other. Embodiments of the present disclosure do not limit thereto, and the connection manner may be set according to actual needs.

In addition, for the connection portions provided in each of the foregoing embodiments, for example, the connection portions 100 of the gate lines 10 and the gate line leads 11, the connection portions 100' of the data lines 20 and the data line leads 21, the connection portions 100" of the common electrode lines 30 and the common electrode lead 31, referring to FIG. 15 or 17, the connection portions (100, 100', 100") are located in a same layer and made of a same material as the pixel electrodes PE in the sub-pixels, that is, the connection portions (100, 100', 100") and the pixel electrodes PE in the sub-pixels are formed by a same patterning process.

It will be noted that, in embodiments of the present disclosure, the pattern process is a process that may include a photolithography process, or may include a photolithography process and an etching process, and may further include other processes for forming a pre-set pattern, such as a printing, an inkjet, and the like. The photolithography process refers to a process for forming a pattern including a film formation, an exposure, a development, or the like, by using of a photoresist, a mask, an exposure machine, or the like. The corresponding patterning process can be selected in accordance with specific structure formed in embodiments of the present disclosure.

In embodiments of the present disclosure, the words "connected" or "coupled" and the like, including directly connected or coupled, or indirectly connected or coupled, are not limited to a physical connection (for example, coupled through via hole(s)), and may also include electrical connected.

In addition, the above-mentioned gate lines and the conductive patterns located in a same layer as the gate lines can be made of one or more materials such as germanium, aluminum, titanium, magnesium or copper. The data lines and the conductive patterns located in a same layer as the data lines can be made of one or more materials such as tantalum, aluminum, titanium, magnesium or copper. The pixel electrodes and the conductive patterns located in a same layer as the pixel electrodes may be made of one or more transparent conductive materials such as Indium Tin Oxide (abbreviated as ITO), Indium Gallium Zinc Oxide (abbreviated as IGZO), and Indium Zinc Oxide (abbreviated as IZO).

Depending on the type of the array substrate (for example, the IPS type), the pixel electrodes may also made of metal material(s), for example, one or more materials of bismuth, aluminum, titanium, magnesium or copper, which are not limited in embodiments of the present disclosure.

Figure 19:
FIG. 19 is a schematic structural diagram of a display device, in accordance with some embodiments of the present disclosure.

Another aspect of embodiments of the present disclosure further provides a display device. As shown in FIG. 19, the display device 02 includes the array substrate 01 described above.

The display device has the same advantageous effects as the array substrate provided by the above embodiments. The structures and beneficial effects of the array substrate have been described in detail in the above embodiments, which will not be described herein.

The above display device may also include an opposite substrate disposed opposite to the array substrate, and a liquid crystal layer disposed between the array substrate and the opposite substrate.

For example, the opposite substrate is a color film substrate. Or, in a case where the array substrate is an array substrate of COA (color filter on array) type, that is, a color filter film is formed on the array substrate, and the opposite substrate is a cover glass.

The above display device may further includes a back light module and a driving circuit portion for providing back lights. Specific structures can refer to the related art, and details are not described herein.

It will be noted that, in the embodiment of the present disclosure, the display device can be any product or component having a display function such as: a liquid crystal panel, an electronic paper, an organic light-emitting diode panel, a mobile phone, a tablet computer, a television, a display, a notebook computer, a digital picture frame, a navigator, etc.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, having a display region and a non-display region, comprising:
   signal lines at least located in the display region; wherein the signal lines include a plurality of gate lines, a plurality of data lines and common electrode lines;
   signal line leads located in the non-display region; wherein the signal line leads include a plurality of gate line leads, a plurality of data line leads and a common electrode lead;
   connection portions located in the non-display region for coupling the signal lines to the signal line leads; and
   a plurality of sub-pixels arranged in a matrix and defined by the plurality of gate lines and the plurality of the data lines crossing in horizontal and longitudinal direction; wherein
   the signal lines and the signal line leads are two separate portions;
   the gate lines are coupled to different gate line leads through different connection portions in one-to-one correspondence; and
   the data lines are coupled to different data line leads through different connection portions in one-to-one correspondence;
   the common electrode lines are coupled to the common electrode lead through the connection portions;
   each of the common electrode lines is disposed between two adjacent gate lines; and
   the common electrode line includes: a third linear body at least located in the display region, and a connection body located in the non-display region; the connection body includes a sixth block body, and the sixth block body is coupled to a corresponding connection portion; wherein
   the connection body further includes a strip-shaped sub-connection body, a strip-shaped direction of the sub-connection body is consistent with an extending direction of the data lines; the third linear body and the sixth block body are respectively located at opposite sides of the sub-connection body along a vertical direction thereof, and the third linear body and the sixth block body are respectively coupled to the sub-connection body at a staggered manner.

2. The array substrate according to claim 1, wherein the connection portions and at least one of the signal lines and the signal line leads are located in different layers.

3. The array substrate according to claim 1, wherein
   the gate line includes: a first linear body at least located in the display region, and a first block body located in the non-display region;
   the gate line lead includes: a gate line lead body located in the non-display region, and a second block body located at an end of the gate line lead body proximate to the display region; and
   the connection portion couples the first block body to the second block body.

4. The array substrate according to claim 1, wherein
   the data line includes: a second linear body at least located in the display region, and a third block body located in the non-display region;
   the data line lead includes: a data line lead body located in the non-display region, and a fourth block body located at an end of the data line lead body proximate to the display region; and
   the connection portion couples the third block body to the fourth block body.

5. The array substrate according to claim 1, wherein
   an extending direction of the common electrode lead is consistent with an extending direction of the data lines, and each of the common electrode lines is coupled to the common electrode lead through a corresponding connection portion;
   or,
   the common electrode lead includes: a lead body with an extending direction that is consistent with an extending direction of the data lines, and a plurality of fifth block bodies coupled to the lead body and extending toward the common electrode lines; each of the plurality fifth blocks bodies corresponds to a connection portion, and each of the common electrode lines is coupled to a corresponding fifth block body through a corresponding connection portion.

6. The array substrate according to claim 1, wherein a distance of the sixth block body from a first gate line is less than a distance of the third linear body from the first gate line, and the first gate line is a gate line that is farther from the third linear body among two gate lines adjacent to the third linear body;
   or, a length of the sub-connection body in an extending direction of the data lines is less than a distance between two gate lines adjacent to the sub-connection body, and the length of the sub-connection body in the extending direction of the data lines is greater than or equal to three quarters (¾) of the distance between the two gate lines adjacent to the sub-connection body;
   or, a distance of the sixth block body from a first gate line is less than a distance of the third linear body from the first gate line, and the first gate line is a gate line that is farther from the third linear body among two gate lines adjacent to the third linear body; and a length of the sub-connection body in an extending direction of the data lines is less than a distance between two gate lines adjacent to the sub-connection body, and the length of the sub-connection body in the extending direction of the data lines is greater than or equal to three quarters (¾) of the distance between the two gate lines adjacent to the sub-connection body.

7. The array substrate according to claim 5, further comprising: a first electrostatic protection line and first electrostatic protection units located in the non-display region, a second electrostatic protection line and second electrostatic protection units located in the non-display region, wherein
   an extending direction of the first electrostatic protection line is consistent with the extending direction of the data lines, and the gate line leads are coupled to the first electrostatic protection line through the first electrostatic protection units;
   an extending direction of the second electrostatic protection line is consistent with an extending direction of the gate lines, and the data lines are coupled to the second electrostatic protection line through the second electrostatic protection units;
   the first electrostatic protection line is located at a side of the common electrode lead away from the display region; and
   the second electrostatic protection line is located at a side of the data line leads proximate to the display region.

8. The array substrate according to claim 7, wherein,
   the first electrostatic protection line and the common electrode lead are an integrated structure; or, the array substrate further comprises a third electrostatic protection unit located in the non-display region, and the first electrostatic protection line is coupled to the common electrode lead through the third electrostatic protection unit;

and/or, the array substrate further comprises a fourth electrostatic protection unit located in the non-display region, and the second electrostatic protection line is coupled to the common electrode lead through the fourth electrostatic protection unit.

9. The array substrate according to claim 8, wherein any one of the first electrostatic protection units, the second electrostatic protection units, the third electrostatic protection unit, and the fourth electrostatic protection unit includes: a first transistor, a second transistor, a first connection terminal, and a second connection terminal;
- a source, a gate of the first transistor and a drain of the second transistor are all coupled to the first connection terminal; a source, a gate of the second transistor and a drain of the first transistor are all coupled to the second connection terminal; and
- the first connection terminal and the second connection terminal are configured to respectively couple two conductors of the array substrate that need to release electrostatic charges to each other.

10. The array substrate according to claim 1, wherein the sub-pixel includes: a pixel electrode and a common electrode coupled to a corresponding common electrode line;
- the pixel electrode includes first strip-shaped sub-electrode(s), and the common electrode includes second strip-shaped sub-electrodes; the first strip-shaped sub-electrode(s) and the second strip-shaped sub-electrodes are alternately arranged, and the first strip-shaped sub-electrode(s) and the second strip-shaped sub-electrodes are both parallel to the data lines; and
- an edge of the sub-connection body proximate to a side of the display region is parallel to the first strip-shaped sub-electrode(s) and the second strip-shaped sub-electrodes.

11. The array substrate according to claim 10, wherein in a same column of sub-pixels between two adjacent data lines, pixel electrodes in the sub-pixels of two adjacent rows are respectively coupled to different data lines among the two adjacent data lines; and
- in a same row of sub-pixels, each pixel electrode is coupled to a data line that is disposed at a same side of each sub-pixel of the row.

12. The array substrate according to claim 10, further comprising: a column of dummy pixels and a dummy data line located in the non-display region, wherein the dummy pixel column is adjacent to a column of sub-pixels in the display region adjacent to the non-display region, and the dummy data line is disposed at a side of the column of dummy pixels away from the display region; and
- the dummy pixel includes: a dummy pixel electrode and a dummy common electrode, wherein dummy pixel electrodes in the column of dummy pixels are not coupled to a data line adjacent to the column of dummy pixels and the dummy data line, and dummy common electrodes in the dummy pixel column are coupled to the common electrode lines.

13. The array substrate according to claim 12, wherein
- the dummy data line is coupled to the common electrode lead;
- or, the dummy data line is parallel to the data lines;
- or, the dummy data line is coupled to the cot non electrode lead and parallel to the data lines.

14. The array substrate according to claim 12, wherein the dummy pixel electrode includes first dummy strip-shaped sub-electrodes, and the dummy common electrode includes second dummy strip-shaped sub-electrodes, wherein the first dummy strip-shaped sub-electrodes and the second dummy strip-shaped sub-electrodes are alternately arranged, and the first dummy strip-shaped sub-electrodes and the second dummy strip-shaped sub-electrodes are parallel to the data lines.

15. The array substrate according to claim 2, wherein the connection portions and at least one of the signal lines and the signal line leads are located in different layers, includes:
- the connection portions, the signal lines and the signal line leads are located in different layers, and the signal lines and the signal line leads are located in a same layer, wherein the connection portions are coupled to the signal line and the signal line leads through first via holes and second via holes, respectively;
- or, the connection portions and the signal line leads are located in a same layer, and the connection portions and the signal lines are located in different layers, wherein the connection portions are directly connected to the signal line leads, and the connection portions are coupled to the signal lines through first via holes;
- or, the connection portions and the signal lines are located in a same layer, and the connection portions and the signal line leads are located in different layers, wherein the connection portions are directly connected to the signal lines, and the connection portions are coupled to the signal line leads through second via holes.

16. A display device, comprising the array substrate according to claim 1.

* * * * *

UNITED STATES PATENT AND TRADEMARK OFFICE
CERTIFICATE OF CORRECTION

PATENT NO. : 11,092,865 B2
APPLICATION NO. : 16/482050
DATED : August 17, 2021
INVENTOR(S) : Hongfei Cheng It is certified that error appears in the above-identified patent and that said Letters Patent is hereby corrected as shown below:

In the Specification

Column 7, Line 3-12, should read:
Since the connection portions 100a and the signal line leads S2 are located in a same layer, the connection portions 100a and the signal line S1 are located in different layers, the array substrate 01 further includes an insulating layer (one or more layers) located between a layer where the connection portions 100a and the signal line leads S2 are located and the signal lines S1. The above first via holes V1 are openings in the insulating layer, so that each connection portion 100a can be coupled to a signal line S1 through a first via hole V1.

In the Claims

Column 22, Line 12-17, Claim 13 should read:
13. The array substrate according to claim 12, wherein the dummy data line is coupled to the common electrode lead;
    or, the dummy data line is parallel to the data lines;
    or, the dummy data line is coupled to the common electrode lead and parallel to the data lines.

Signed and Sealed this
Twenty-sixth Day of April, 2022

Katherine Kelly Vidal
*Director of the United States Patent and Trademark Office*